United States Patent
Graves et al.

(10) Patent No.: US 11,561,607 B2
(45) Date of Patent: Jan. 24, 2023

(54) ACCELERATING CONSTRAINED, FLEXIBLE, AND OPTIMIZABLE RULE LOOK-UPS IN HARDWARE

(71) Applicant: HEWLETT PACKARD ENTERPRISE DEVELOPMENT LP, Houston, TX (US)

(72) Inventors: Catherine Graves, Milpitas, CA (US); Can Li, Palo Alto, CA (US); John Paul Strachan, Milpitas, CA (US); Dejan S. Milojicic, Milpitas, CA (US); Kimberly Keeton, Palo Alto, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 123 days.

(21) Appl. No.: 17/085,805

(22) Filed: Oct. 30, 2020

(65) Prior Publication Data
US 2022/0138204 A1  May 5, 2022

(51) Int. Cl.
| | | |
|---|---|---|
| G11C 16/04 | (2006.01) | |
| G06F 1/3296 | (2019.01) | |
| G11C 13/00 | (2006.01) | |
| G06F 1/3206 | (2019.01) | |
| G11C 27/00 | (2006.01) | |

(52) U.S. Cl.
CPC .......... *G06F 1/3296* (2013.01); *G06F 1/3206* (2013.01); *G11C 13/0038* (2013.01); *G11C 27/005* (2013.01)

(58) Field of Classification Search
CPC .................... G11C 13/0038; G11C 27/005
See application file for complete search history.

(56) References Cited

U.S. PATENT DOCUMENTS

| | | | |
|---|---|---|---|
| 6,288,922 B1 * | 9/2001 | Wong ................... | G11C 15/04 365/49.17 |
| 6,442,090 B1 | 8/2002 | Ahmed et al. | |
| 6,985,372 B1 * | 1/2006 | Blyth .................. | G11C 15/046 365/45 |
| 7,050,317 B1 | 5/2006 | Lien et al. | |

(Continued)

OTHER PUBLICATIONS

Bandi, N. et al., "Hardware Acceleration of Database Operations Using Content-Addressable Memories," Proceedings of the First International Workshop on Data Management on New Hardware (DaMoN 2005); Jun. 12, 2005, https://dl.acm.org/doi/pdf/10.1145/1114252.1114262.

(Continued)

*Primary Examiner* — Pho M Luu
(74) *Attorney, Agent, or Firm* — Sheppard Mullin Richter & Hampton LLP

(57) ABSTRACT

Encoding of domain logic rules in an analog content addressable memory (aCAM) is disclosed. By encoding domain logic in an aCAM, rapid and flexible search capabilities are enabled, including the capability to search ranges of analog values, fuzzy match capabilities, and optimized parameter search capabilities. This is achieved with low latency by using only a small number of clock cycles at low power. A domain logic ruleset may be represented using various data structures such as decision trees, directed graphs, or the like. These representations can be converted to a table of values, where each table column can be directly mapped to a corresponding row of the aCAM.

20 Claims, 10 Drawing Sheets

(56) References Cited

U.S. PATENT DOCUMENTS

| | | |
|---|---|---|
| 7,206,212 B1 | 4/2007 | Chou |
| 7,272,684 B1 | 9/2007 | Chou |
| 7,554,844 B2 | 6/2009 | Werner et al. |
| 7,899,978 B2 | 3/2011 | Pandya |
| 8,165,924 B2 | 4/2012 | Smyers et al. |
| 8,654,555 B2 | 2/2014 | Shin et al. |
| 9,543,013 B1 | 1/2017 | Govindaraj et al. |
| 9,613,701 B2 | 4/2017 | Roy et al. |
| 9,721,661 B1 | 8/2017 | Buchanan et al. |
| 10,051,093 B2 | 8/2018 | Cortes et al. |
| 10,340,007 B2 | 7/2019 | Zidan et al. |
| 10,896,731 B1 | 1/2021 | Li et al. |
| 10,998,047 B1 | 5/2021 | Li et al. |
| 2005/0169095 A1 | 8/2005 | Bedeschi et al. |
| 2013/0054886 A1 | 2/2013 | Eshraghian et al. |
| 2014/0092664 A1 | 4/2014 | Bourianoff et al. |
| 2016/0284408 A1 | 9/2016 | Chiou et al. |
| 2018/0040374 A1 | 2/2018 | Zheng et al. |
| 2020/0075099 A1 | 3/2020 | Choi et al. |
| 2020/0258587 A1 | 8/2020 | Li et al. |
| 2022/0122646 A1* | 4/2022 | Graves ............... G11C 15/046 |

OTHER PUBLICATIONS

Bu, L. et al., "A Keyword Match Processor Architecture using Content Addressable Memory," Proceedings of the 14th ACM Great Lakes symposium on VLSI, Apr. 26-28, 2004, pp. 372-376, https://dl.acm.org/doi/pdf/10.1145/988952.989042.

Bahloul et al., "Hardware Emulation of Memristor Based Ternary Content Addressable Memory," 2017 14th International Multi Conference on Systems, Signals & Devices (SSD), Dec. 13, 2017, pp. 446-449.

Chiao-Ying Huang, "Ternary Content-addressable Memory Circuits," Midterm Report—IEE5009: Memory System, Institute of Electronics, National Chiao-Tung University, Fall 2012, pp. 1-7.

Guo et., "A Resistive TCAM Accelerator for Data-Intensive Computing," MICRO'11 Dec. 3-7, 2011, 2011, 12 pages.

Han et al., "A Novel Ternary Content Addressable Memory Design Based On Resistive Random Access Memory With High Intensity and Low Search Energy," Japanese Journal of Applied Physics, Apr. 2018, vol. 57, No. 4S, pp. 04FE02-1-04FE02-5.

Harada et al., "A Content-addressable Memory Using "Switched Diffusion Analog Memory with Feedback Circuit"," IEICE Trans. Fundamentals, vol. E82-A, No. 2, Feb. 1999, pp. 370-377.

Li et al., "NVSim-CAM: A Circuit-Level Simulator for Emerging Nonvolatile Memory based Content-Addressable Memory," 2016 IEEE/ACM International Conference on Computer-Aided Design (ICCAD), Nov. 7, 2016, 7 pages.

Lin et al., "Random Forest Architectures on FPGA for Multiple Applications," GLSVLSI '17: Proceedings of the on Great Lakes Symposium on VLSI 2017, May 10-12, 2017, pp. 415-418.

Lucchese et al., "QuickScorer: A Fast Algorithm to Rank Documents with Additive Ensembles of Regression Trees," Proceedings of the 38th International ACM SIGIR Conference on Research and Development in Information Retrieval, Aug. 2015 pp. 73-82.

Rusch et al., "The Design of an Analog Associative Memory Circuit for Applications in High-dimensional Computing," Technical Report No. UCB/EECS-2018-72, University of California, May 18, 2018, 28 pages.

Shen et al., "A Hybrid TCAM+SRAM Scheme for Multi-Match Packet Classification," 2012 13th International Conference on Parallel and Distributed Computing, Applications and Technologies, Dec. 14-16, 2012, pp. 685-690.

Zhao et al., "RFAcc: A 3D ReRAM Associative Array based Random Forest Accelerator," International Conference on Supercomputing (ICS '19), Jun. 26-28, 2019, 11 pages.

Li et al., "Analog content addressable memories with memristors", Nature communications, 2020, 22 pages.

Li et al., "Analog content addressable memories with memristors", Nature Communications, 2020, 8 pages.

* cited by examiner

ACCELERATING CONSTRAINED, FLEXIBLE, AND OPTIMIZABLE RULE LOOK-UPS IN HARDWARE

DESCRIPTION OF RELATED ART

Domain logic rule management systems are configured to manage the variety and complexity of decision logic that is used by operational systems within an organization or enterprise. DLRM systems typically receive, as input, a set of search query variables, evaluate the query variables against domain logic rules, and output a decision or action to be taken based on the results of the search. Such systems are applicable to a wide range of application scenarios.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
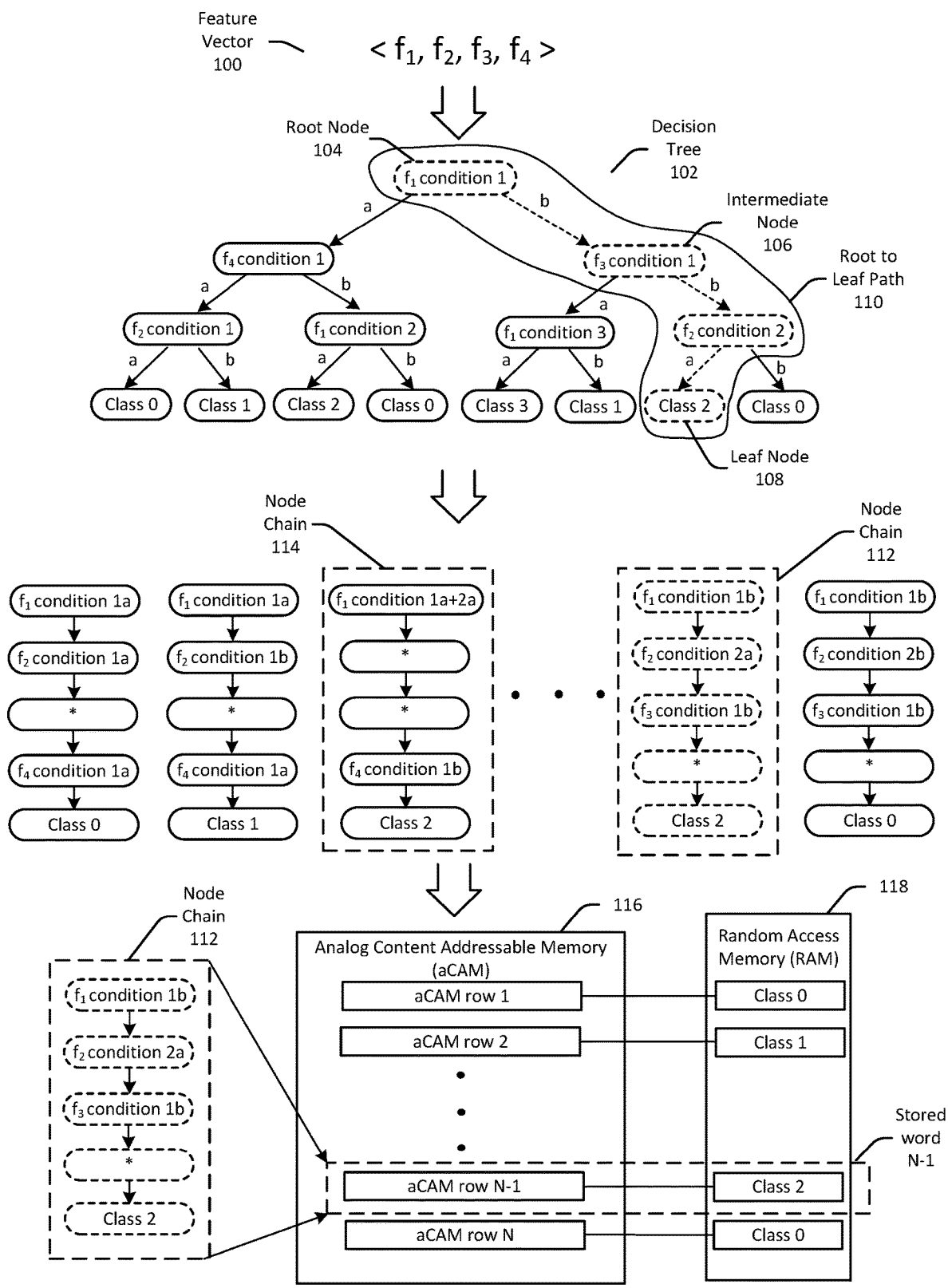
FIG. 1 is a flow diagram depicting conversion of a first data structure representing a set of logical rules to a second data structure representing the logical rules and encoding of values of the second data structure in an analog content addressable memory (aCAM) according to example embodiments of the invention.

The figures are not exhaustive and do not limit the present disclosure to the precise form disclosed.

DETAILED DESCRIPTION

Example embodiments of the invention relate to systems, devices, methods, and non-transitory computer readable media for encoding logical rules, such as a domain-related logical ruleset, in an analog content addressable memory (aCAM) so as to enable rapid, parallel searching of the encoded rules; storing and searching flexible parameter values; storing and searching analog ranges of values, and fuzzy matching on stored values or stored ranges of values.

Domain logic rule management (DLRM) systems are configured to receive domain-related logical rules and search queries as input and evaluate the search query variables against the domain logic to identify any matching search results. DLRM systems may use various types of data structures (e.g., decision trees, directed graphs, etc.) to represent a set of domain-related logical rules. Conventionally, such data structures are stored in memory such as static random access memory (SRAM), which does not enable parallel searching of the data structures. When there are a limited number of variables and domain rules to encode and evaluate, the processing can be completed with relatively low latency. Real-world application scenarios, however, are often quite complex, potentially requiring searching and evaluating many thousands of domain logic rules with respect to a large number of query variables. Searching data structures that store a large number of domain logic rules in memory results in the technical problem of high processing latency, which can become increasingly exacerbated as the number of logical rules and the number of search variables against which such rules are evaluated increases. This high processing latency can disrupt the user experience and increase the cost to the service provider. Moreover, conventional techniques for domain logic rule management exhibit a number of additional technical problems including the inability to store and search flexible parameter values, the inability to store and search ranges of analog values, and the inability to allow for degrees of uncertainty (e.g., fuzzy matching).

Example embodiments of the invention provide technical solutions to each of the above-described technical problems associated with conventional DLRM systems and the data and memory structures used by conventional DLRM systems to encode domain logic rulesets. In particular, example embodiments of the invention provide improved techniques for encoding domain logic rulesets so as to enable rapid and flexible search capabilities, including the capability to search ranges of values, as well as fuzzy match capabilities. More specifically, according to example embodiments of the invention, and as will be described in more detail later in this disclosure, domain-related logical rules (also sometimes interchangeably referred to herein as domain logical rules, domain logic rules, a domain logic ruleset, or more generally, logical rules) are encoded in an aCAM that enables rapid, parallel, and flexible searching of the domain logic rules; searching ranges of values; and performing fuzzy searches, all while using a small number of clock cycles (low latency) at low power. As such, the technical solutions provided by example embodiments of the invention constitute a technological improvement to existing DLRM systems and techniques for searching and matching search variables against a domain logic ruleset.

The improved techniques of example embodiments of the invention are applicable to a wide range of application scenarios such as a travel planning search scenario in which a user queries all possible flights from a specified origin to a specified destination; a web store application scenario according to which a user queries a web store for various combinations of product offerings, where the search variables may include, for example, product type, product features, brand, cost range, customer reviews/rankings, or the like; and a scenario in which an interview schedule is determined for an interview candidate from intersecting interviewer schedules, to name a few. In each of these example scenarios, as well as in many other real-world application scenarios, the number of domain-related logical rules and search variables that need to be evaluated can be quite large, resulting in higher processing latencies for conventional DLRM systems tasked with performing the searching and matching. By encoding domain logical rules in an aCAM, example embodiments of the invention achieve significantly lower searching and matching latencies than conventionally implemented DLRM systems, while at the same time, being able to leverage the flexible, range, and fuzzy searching capabilities of the aCAM.

A search query executed by an aCAM that encodes a set of domain-related logical rules in accordance with example embodiments may include one or more constrained search parameters and an optimized parameter. Optionally, the search query may also include one or more flexible search parameters. The terms parameter and variable may be used interchangeably herein. More specifically, the search query may specify a discrete value or a continuous range of values for each of one or more parameters (the constrained search parameters) and may indicate one or more other parameters as being flexible parameters that would match against any stored values for those parameters. Moreover, the search query may specify a parameter that a user seeks to optimize with respect to the other search parameters. Optimizing a parameter may include, without limitation, maximizing the parameter, minimizing the parameter, maintaining the parameter within a certain range, or the like.

For instance, referring to the travel search application scenario introduced above, the origin and destination specified in the search query may be the constrained search parameters, the airline may be a flexible parameter, and the optimized parameter may be total travel time, which a user may seek to minimize. In the example product search application scenario, the optimized parameter may be, for example, total product cost. In some example embodiments, a search query may specify an initial maximum permitted value for the optimized parameter (e.g., a maximum total allowable travel time). The specified value for the optimized parameter may then be iteratively adjusted across search cycles depending on the number of match results obtained at each search cycle until one or more results are returned that optimize (e.g., minimize) the search parameter to at or below a desired value.

For example, if a user seeks to optimize the total travel time parameter and the search query specifies 2 hours for this parameter but no match results are identified (i.e., no travel routes that satisfy the constrained search parameters and have a total travel time of 2 hours or less are identified), the user may be prompted to increase the value specified for the total travel time in a subsequent query. This process may proceed iteratively until a desired number of search results are returned that satisfy the constrained search parameters as well as the value specified for the optimized parameter. Similarly, if too many match results (e.g., more than some specified threshold number of match results) are identified based on the initial value supplied for the optimized parameter, the user may be prompted to iteratively decrease the optimized parameter value until a more manageable number of search results are returned (e.g., less than the threshold number). It should be appreciated that in some example embodiments the iterative adjustment of the optimized parameter value may be performed according to an automated script or the like, thereby obviating the need for a user to iteratively refine the search queries.

As previously noted, real-world application scenarios often involve searching and evaluating many thousands of domain logic rules with respect to a large number of query variables. This can lead to significantly higher processing latencies for searching and matching queries, which in turn, can cause disruption to the user experience and increase the cost to the service provider. Example embodiments of the invention relate to devices, systems, methods, techniques, and non-transitory computer-readable media for encoding a set of domain-related logical rules in an aCAM that enables both matching of flexible queries and storing and searching of continuous ranges of values. In example embodiments, each domain-related logical rule may represent a series of evaluable conditions with respect to a set of variables. Values representative of the evaluable conditions may then be encoded into an aCAM to enable rapid, parallel searching of the set of domain-related logical rules.

An evaluable condition may include determining whether a search variable equals a discrete value, determining whether a search variable falls within a stored range of values, or the like. An aCAM may be used to encode the values associated with the evaluable conditions. As will be described in more detail later in this disclosure, an aCAM may be configured to encode not only discrete values but also ranges of analog values (also referred to herein as analog ranges of values), thereby providing the capability to encode, search, and match against an evaluable condition involving a comparison of a search variable to an analog range of values. An aCAM may also provide the capability to specify a range of values as a search variable. In addition, the aCAM supports matching of flexible search queries including both storing a flexible "don't care" value for a parameter that matches against any value specified for that parameter in a search query as well as permitting a search query to include a "don't care" value for a parameter that matches against any value that may be stored in the aCAM for that parameter. According to example embodiments of the invention, any of the aCAM structures disclosed in co-pending and commonly-owned U.S. application Ser. Nos. 16/274,379, 16/744,136, or 16/526,455 may be employed to encode domain logic rules in a manner that allows for rapid and flexible searching of the encoded rules.

Generally speaking, a CAM receives an input search word which it then compares against stored words in the CAM to identify any stored word(s) that match the search word. If the CAM locates a matching stored word, the CAM may return the address of the stored word in the CAM. In a typical CAM implementation, the search word may include n bits, with each bit being provided as input to the CAM along a corresponding search line. The CAM may then perform a parallel search according to which the search word is compared, in parallel, to each of the stored words in the CAM. Any stored word that matches the search word may be identified based on the voltage observed on a corresponding match line. For instance, each match line may be pre-charged to a high voltage, which is then discharged if the corresponding stored word does not match the search word. Any match line that remains at high voltage may indicate a match.

A particular type of CAM is a ternary CAM, also referred to as a TCAM. Conventionally, a TCAM is implemented in volatile memory such as static random access memory (SRAM) and stores the ternary information in two binary memory cells that together are capable of representing a ternary bit that may take on any of three values: 0, 1, or a "don't care" value. A "don't care" value is represented in the Figures, and at times hereinafter, using the "*" character. A stored word that includes a "don't care" value at a particular bit position will output a match for that bit position regardless of the value of the search word at that bit position. Similarly, each bit of the search word may take on a 0, 1, or a "don't care" value. A "don't care" value specified at a particular bit position in the search query matches against any value that may be stored in the TCAM at that bit position. Thus, a TCAM enables flexible search queries by permitting both the storage and searching of a "don't care" value.

An aCAM, such as any of those described in U.S. application Ser. Nos. 16/274,379, 16/744,136, or 16/526,455, may include a series of cells arranged in rows and columns. In example embodiments, a respective one or more cells of the aCAM may be used to represent a stored value or a stored range of values for each search parameter/variable. As will be described in more detail later in this disclosure in reference to FIG. 2, in example implementations, each aCAM cell may include a set of transistors and 2 memristors. Respective conductances of the memristors may be tuned to represent lower and upper voltage bounds of a matching analog voltage range for the aCAM cell. A voltage applied to a data line may be received at an aCAM cell, and a match result may be outputted if the data line voltage is within the analog voltage range defined by the respective memristor conductances. In this manner, the aCAM cell is able to store an analog range of values because any value contained within the range of values would correspond to a data line voltage that falls within a corresponding analog voltage range established by the aCAM cell. Further, because an aCAM enables flexible searching, it is also a TCAM.

FIG. 1 is a flow diagram depicting conversion of a first data structure representing a set of logical rules to a second data structure representing the logical rules and encoding of values of the second data structure in an aCAM according to example embodiments of the invention. In example embodiments, the first data structure may be a decision tree 102. The decision tree 102 may include a set of decision nodes including a root node 104, various intermediate nodes (e.g., intermediate node 106), and various leaf nodes (e.g., leaf node 108) that represent terminus points of the decision tree 102. It should be appreciated that the decision tree 102 is merely an illustrative implementation of the first data structure. Other data structures are contemplated including, without limitation, arrays, lists, hash-based structures, graphs, and so forth.

The decision tree 102 may include multiple root-to-leaf paths. Each root-to-leaf path represents a traversal of a series of nodes in the decision tree 102 beginning at the root node 104, passing through various intermediate nodes, and ending at a given leaf node. In example embodiments, each decision node traversed in a given root-to-leaf path represents a respective evaluable condition involving a corresponding feature of a feature vector 100. As such, each root-to-leaf path represents a series of evaluable conditions representative of a logical rule against which an input feature vector can be evaluated. In this manner, the decision tree 102 is a type of data structure used in DLRM systems to represent a domain logic ruleset.

In the example root-to-leaf path 110 shown in FIG. 1, the series of evaluable conditions may begin with the condition evaluated at the root node 104, which is illustratively depicted as involving feature $f_1$ of the feature vector 100. In the example decision tree 102, evaluating the condition represented by any given decision node may result in one of two possible outcomes, labeled as outcome 'a' and outcome 'b'. In some example embodiments, outcome 'b' represents the condition not being satisfied when evaluated and outcome 'a' represents the condition being satisfied when evaluated. For instance, if the evaluable condition at the root node 104 is whether $f_1$ is less than a value $x_1$, outcome 'b' may represent a negative determination (i.e., $f_1 \geq x_1$) and outcome 'a' may represent a positive determination (i.e., $f_1 < x_1$). It should be appreciated that in other implementations more than two outcomes may be possible for an evaluable condition associated with a node.

In the example root-to-leaf path 110, the outcome of the determination at the root node 104 is illustratively depicted as outcome 'b', which indicates that the condition evaluated at the root node 104 involving feature $f_1$ is not satisfied. Based on this outcome, the root-to-leaf path 110 transitions from the root node 104 to intermediate node 106. Transitions from a first node to a second node within a given root-to-leaf path are represented as a combination of the condition evaluated at the first node and the outcome of that evaluation. For instance, the transition from the root node 104 to the intermediate node 106 in the example root-to-leaf path 110 is represented as $f_1$ condition 1b. Using this convention, the example root-to-leaf path 110 can be represented by the following node transitions: $f_1$ condition 1b->$f_3$ condition 1b->$f_2$ condition 2a->Class 2. Each other root-to-leaf path in the decision tree 102 may be similarly represented as a series of node transitions indicative of the condition evaluated at each node in combination with the outcome of that evaluation.

In example embodiments, the information contained in the decision tree 102 may be converted to an alternate representation such as a tabular representation. In particular, each root-to-leaf path in the decision tree 102 may be represented as a corresponding column in the tabular representation, referred to herein as a node chain. For instance, the example root-to-leaf path 110 may be converted to the node chain 112. Each node in the node chain 112 may correspond to one or more node transitions in the corresponding root-to-leaf path 110. More specifically, each node in the node chain 112 corresponds to a respective feature in the feature vector 100. Because the feature vector 100 is illustratively depicted as including four features ($f_1$, $f_2$, $f_3$, and $f_4$), each node chain may include four nodes corresponding to the four features as well as a node representing the leaf node of the corresponding root-to-leaf path. It should be appreciated that the feature vector 104 may contain any number of features, in which case, corresponding node chains may include a corresponding number of nodes along with a leaf node. In some example embodiments, the leaf nodes may also correspond to a feature (e.g., an optimized parameter) that forms part of the feature vector 100.

In example embodiments, certain root-to-leaf paths may not include evaluable conditions for one or more features. For instance, the root-to-leaf path 110 does not include an evaluable condition for feature $f_4$. For any such feature that does not have at least one associated evaluable condition in a root-to-leaf path, a "don't care" value may be used for the node that corresponds to that feature in the node chain that represents that root-to-leaf path. For instance, for root-to-leaf path 110, a "don't care" value is used for the node in the node chain 112 that corresponds to feature $f_4$. This means that any value specified for feature $f_4$ in a search query would result in a match with respect to feature $f_4$ when evaluated against node chain 112 after it has been encoded in an aCAM 116.

In addition, in connection with converting the representation of the set of domain logic rules from the decision tree 102 to the tabular representation, nodes within a given root-to-leaf path may be consolidated and/or reordered when determining the sequence of corresponding nodes in the node chain that represents that root-to-leaf path. For instance, an evaluable condition involving feature $f_3$ occurs before an evaluable condition involving feature $f_2$ in the sequence of nodes traversed as part of the root-to-leaf path 110. However, prior to encoding the node chain 112 in the aCAM 116, the sequence of evaluable conditions represented by the path 110 may be reordered to ensure that the sequence of the evaluable conditions in the corresponding node chain 112 matches the sequence of features in the feature vector 100. This reordering may occur, as needed, for each root-to-leaf path in the decision tree 102 as part of converting the root-to-leaf path to a corresponding node chain in the tabular representation.

More specifically, each node chain in the tabular representation (e.g., each column in a table) may begin with a node representing an evaluable condition involving feature $f_1$ in the corresponding root-to-leaf path, followed by an evaluable condition involving feature $f_2$, and so on until the penultimate node in the node chain is an evaluable condition involving the last feature $f_n$ in the feature vector (e.g., feature $f_4$ in the example feature vector 100), with the final node being the appropriate leaf node (alternatively each leaf node may correspond to a last feature $f_n$ in the feature vector). Moreover, as previously described, if a given root-to-leaf path does not include an evaluable condition for a particular feature, then the "don't care" value may be associated with a corresponding node in the node chain. This ensures that each node chain in the tabular representation includes a same number of nodes regardless of which features are evaluated in the corresponding root-to-leaf path. Thus, the node transition for the example root-to-leaf path 110 ($f_1$ condition 1b->$f_3$ condition 1b->$f_2$ condition 2a->Class 2) may be reordered when represented as the node chain 112 to place the node for $f_2$ condition 2a before the node for $f_3$ condition 1b. In addition, because the root-to-leaf path 110 does not include an evaluable condition involving feature $f_4$, a "don't care" value may be used for the node in node chain 112 that corresponds to feature $f_4$. The sequence of nodes in node chain 112 may then become: $f_1$ condition 1b->$f_2$ condition 2a->$f_3$ condition 1b->*->Class 2.

In some example embodiments, converting a root-to-leaf path to a corresponding node chain may include consolidating two or more node transitions in the path into a single node in the node chain. For example, consider the root-to-leaf path in decision tree 102 that includes the following node transitions: $f_1$ condition 1a->$f_4$ condition 1b->$f_1$ condition 2a->Class 2. Two node transitions in this example path occur as a result of evaluating conditions involving feature $f_1$. As such, these two node transitions may be consolidated into the single node associated with feature $f_1$ in the corresponding node chain 114 (represented as $f_1$ condition 1a+2a). For example, if $f_1$ condition 1a represents $f_1 > x_1$ and if $f_1$ condition 2a represents $f_1 < x_2$, the consolidated result (i.e., $x_1 < f_1 < x_2$) may be represented in the first node of the node chain 114 (e.g., the node associated with the feature $f_1$). Consolidating multiple node transitions involving a particular feature variable into a single consolidated node for that feature variable may increase the memory density and reduce the amount of area needed when encoding the set of logical rules represented by the decision tree 104 into an aCAM.

The conversion of the example root-to-leaf path involving the sequence of node transitions identified above to the node chain 114 involves all of the types of data manipulations described above, specifically, consolidating node transitions (combining $f_1$ condition 1a and $f_1$ condition 2a); reordering node transitions (moving $f_4$ condition 1b to a position in the node chain 114 that is after the nodes corresponding to features $f_1$, $f_2$, and $f_3$); and inserting "don't care" values for particular nodes in the node chain 114 that do not have evaluable conditions in the corresponding root-to-leaf path ("don't care" values for features $f_2$ and $f_3$). After performing each of these manipulations, node chain 114 results in the following sequence of nodes: $f_1$ condition 1a+2a->*->*->$f_4$ condition 1b->Class 2. In example embodiments, the set of all root-to-leaf paths represented in the decision tree 102 may be converted to a corresponding set of node chains according to the methodology described above.

Once the conversion process is complete and the tabular representation of the domain logic rules is generated, each node chain in the tabular representation may be rotated and mapped to a respective row of aCAM 116. In some example embodiments, the sequence of node chains in the tabular representation may be dictated by a convention that defines an order in which the decision tree 102 is traversed to cover all root-to-leaf paths represented in the decision tree 102. Further, in some example embodiments, the sequence of node chains in the tabular representation may be mapped and encoded to rows of the aCAM 116 in the same sequence. In other example embodiments, the sequencing of the node chains may not be relevant as long as each root-to-leaf node in the decision tree 102 is converted to a respective corresponding node chain, and each node chain is mapped to and encoded in a respective row of the aCAM 116.

As shown in FIG. 1, the node chain 112 may be mapped to and encoded in a particular row of the aCAM 116 (e.g., aCAM row N-1). More specifically, each value represented in each node of the node chain 112 may be stored using a respective corresponding one or more cells of the aCAM 116 in row N-1. Each other node chain such as, for example, node chain 114 may be similarly mapped to and encoded in a respective row of the aCAM 116. In some example embodiments, the value represented in a node of the node chain 112 may in fact be a range of values. As previously noted, the aCAM 116 provides the capability to store and encode such ranges of values. The number of aCAM cells required to encode the values/ranges of values corresponding to a particular feature (e.g., feature $f_1$) across all node chains (i.e., the number of aCAM cell columns corresponding to feature $f_1$) may depend on the level of precision required to encode such values/ranges of values. For a feature in the feature vector 100 that is a categorical variable that can take on only a limited number of discrete values (e.g., the set of all origin or destination airports), a single column of aCAM cells may be sufficient to represent all stored values for that feature across the set of domain logic rules. On the other hand, for a feature that corresponds to a numeric variable capable of taking on a large number of possible values (e.g., a continuous range of values), multiple columns of aCAM cells may be required to provide the bit precision needed to store such values.

In some example embodiments, an output parameter of each node chain (domain logic rule) encoded in the aCAM 116 may in fact be stored in a memory array separate from the aCAM 116. For instance, as illustratively shown in FIG. 1, each of the leaf nodes of the decision tree 102 represent classification outputs that may be stored in a random access memory (RAM) 118 separate from the aCAM 116. This may then allow for multiple matches to be returned for a search query. In example embodiments, a search query may conform to the format of the feature vector 100 and may specify a discrete value, a range of values, or a "don't care" value for each search variable (i.e., each feature in the feature vector 100). The search query may then be searched, in parallel, against each row in the aCAM to determine if the search query matches the stored values in any such row. Each row of the aCAM 116 may represent a stored word that corresponds to a particular node chain, and thus, a particular root-to-leaf path in the decision tree 102. In some example embodiments, a stored word may include only those values stored in a particular row of the aCAM 116. In other example embodiments, a stored word may include the values of a particular aCAM row as well as a corresponding value of the output parameter (e.g., the classification output value) stored in the RAM 118.

In some example embodiments, the output parameter (e.g., the classification outputs represented by the leaf nodes of the decision tree 102) may be a parameter that a user seeks to optimize. For example, a search query may specify a maximum or minimum allowable value for the optimized parameter, in which case, any row in the aCAM 116 that matches each of the constrained and/or flexible parameter values specified in the search query and that satisfies the value specified for the optimized parameter may be returned as a match result. More specifically, the address of any such matching row in the aCAM 116 may be returned as a search result. Optionally, the corresponding value for the optimized parameter stored in the RAM 118 (or the memory address in the RAM 118 for the corresponding value) may also be returned.

In other example embodiments, rather than searching for stored rows in the aCAM 116 that correspond to output parameter values that are below (or above) a specified value as part of an optimization process, a search query may instead specify a value for the output parameter that requires an exact match among the values for the output parameter stored in the RAM 118. For instance, in such example embodiments, a search query may result in a match only if 1) all other search parameter values specified in the search query match corresponding stored values in a given row of the aCAM 116 and 2) the output parameter value specified in the search query exactly matches a value stored in the RAM 118 that corresponds to that row in the aCAM 116. Thus, in such example embodiments, a search query that includes search variable values that satisfy the first four nodes of node chain 112, but that specifies "Class 3" for the output parameter value would not produce a match at stored word N−1.

In still other example embodiments, a search query may specify an exclusionary value for the output parameter. For instance, the search query may specify "Class 2" as an exclusionary value for the output parameter in FIG. 1. Such an example search query would then produce a matching result for any row in the aCAM 116, and thus, any node chain in the tabular representation and corresponding root-to-leaf path in the decision tree 102, that matches each of the other constrained parameters in the search query and that corresponds to a stored output parameter value other than "Class 2." This may represent a mechanism for optimizing the output parameter by specifying values to be excluded from matching rather than through iterative adjustment of the optimized parameter.

Figure 2:
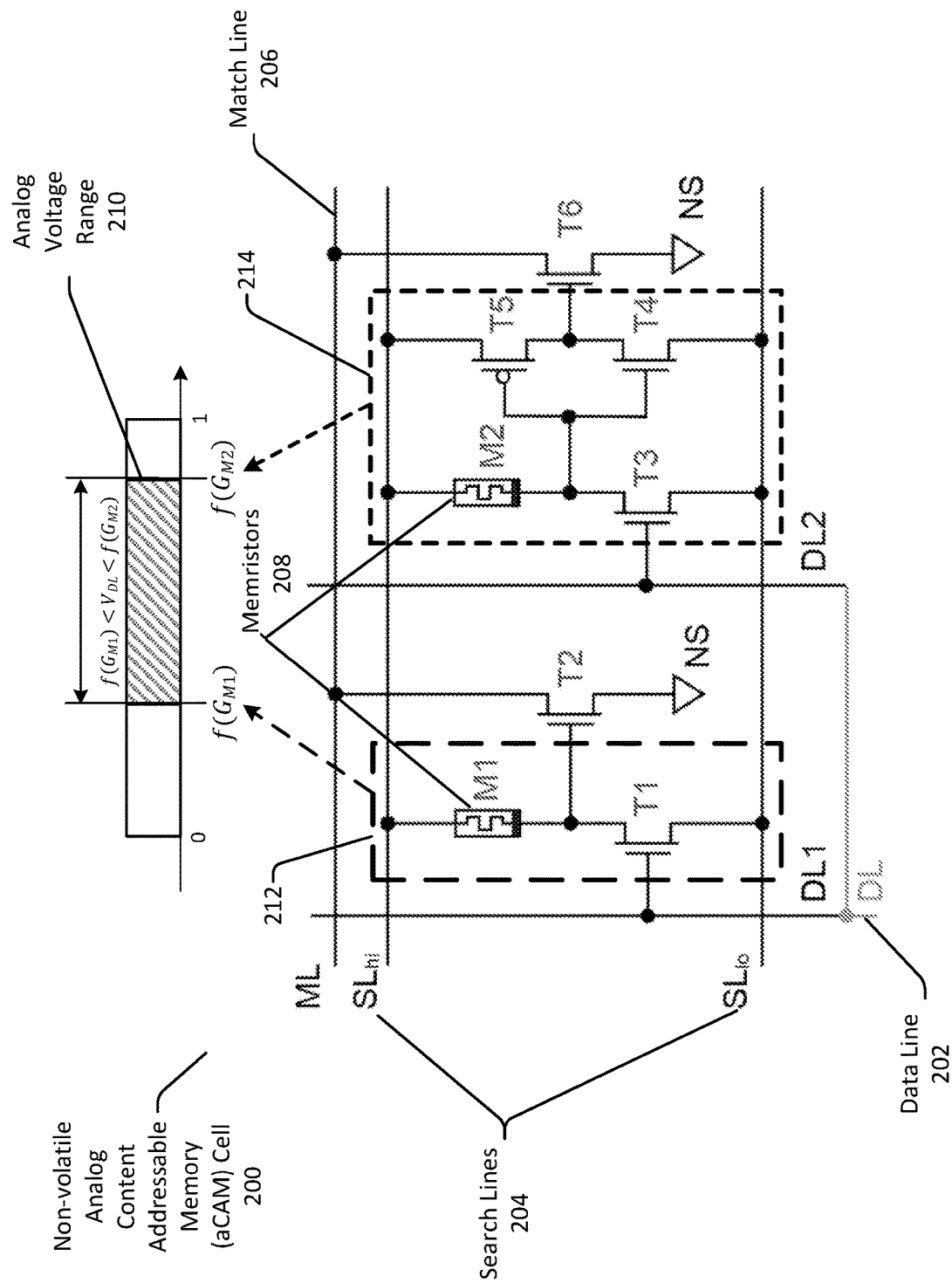
FIG. 2 depicts an example aCAM cell configurable to store an analog range of values according to example embodiments of the invention.

FIG. 2 depicts an example aCAM cell 200 configurable to store an analog range of values according to example embodiments of the invention. Rather than being implemented in volatile memory such as SRAM, the aCAM cell 200 is implemented using non-volatile components such as memristors 208. The aCAM cell 200 may constitute a unit element of the aCAM 116 of FIG. 1. In the example implementation depicted in FIG. 2, the aCAM cell 200 includes six transistors (T1-T6) and 2 memristors (M1 and M2). The transistors may include various combinations of n-type and p-type transistors. As a non-limiting example, the transistors may include five n-type metal oxide semiconductor (MOS) field-effect transistors (MOSFETs) and one p-type MOSFET. It should be appreciated that other types of transistors employing any of a variety of types of semiconductor materials may be used. It should be appreciated that the aCAM cell 200 depicted in FIG. 2 represents an example circuit architecture for implementing aspects of embodiments of the invention such as the storage of an analog range of values. Alternative aCAM circuit architectures such as any of those described in U.S. application Ser. Nos. 16/274,379, 16/744,136, or 16/526,455 may be used.

In example embodiments, an input search variable is mapped to a voltage amplitude $V_{DL}$ that is applied along a data line 202. It should be appreciated that the data line 202 may also be connected to each other aCAM cell in a same column of the aCAM as the aCAM cell 200. Each column of cells in the aCAM may store data relating to a respective input search variable, with some search variables corresponding to multiple aCAM columns if greater bit precision is required. The voltage $V_{DL}$ along the data line 202 is divided into voltages $V_{DL1}$ and $V_{DL2}$ and fed to the divider sub-circuits 212, 214, respectively. In example embodiments, the aCAM cell 200 stores an upper bound and a lower bound for matching against an input search variable. More specifically, programmed conductances $G_{M1}$ and $G_{M2}$ of the memristors M1 and M2, respectively, may be tuned to establish a lower voltage bound f(Gm') and an upper voltage bound f($G_{M2}$) of an analog voltage range 210 that represents a continuous analog range of values stored in the aCAM cell 200. That is, the lower voltage bound enforced by the aCAM cell 200 may be a function of the conductance of the memristor M1 and the upper voltage bound may be a function of the conductance of the memristor M2.

In example embodiments, the aCAM cell 200 may be one of several aCAM cells in a same row of an aCAM. The aCAM cell 200 and each other aCAM cell in the same row may be connected to a match line 206. Similarly, each other row in the aCAM may be connected to a respective match line. Each row of an aCAM may correspond to a stored word against which a search word is evaluated to determine if a match exists. In example embodiments, the search operation may begin by pre-charging each aCAM row's match line to a high logic level (e.g., a high voltage). A match line (e.g., the match line 206) remains at the high voltage (which indicates a match) only if all of the aCAM cells in the aCAM row connected to the match line match their corresponding inputs. If a search input does not match data stored in a corresponding aCAM cell, the cell may discharge the match line to which it is connected, leading to a low logic level on the match line that is indicative of a mismatch.

Referring now to the aCAM cell 200 implementation in more detail, the lower and upper voltage bounds are encoded by voltage divider sub-circuits 212, 214, which respectively determine the gate voltages of pull-down transistors T2 and T6, each of which is connected to the match line 206. The voltage divider sub-circuit 212 includes a transistor T1 and a memristor M1 connected in series, which control a gate voltage G1 of the pull-down transistor T2 that embodies the aCAM cell's 200 lower bound match threshold. The upper bound is configured similarly with an independent voltage divider sub-circuit 214 that includes a transistor T3 and a memristor M2 connected in series as well as an inverter (transistors T4 and T5 operate as an inverter) to control a gate voltage G2 of the pull-down transistor T6.

The match line 206 is connected to pull-down transistors T2 and T6, and is kept high for a "match" result when both the gate voltage G1 of the pull-down transistor T2 is smaller than the threshold voltage of T2 and the gate voltage G2 of the pull-down transistor T6 is smaller than the threshold voltage of T6, keeping both transistors T2 and T6 in a high resistance (OFF) state. More specifically, when $V_{DL1}$ is larger than a threshold voltage of transistor T1, the transistor T1 is highly conductive. As a result, the search voltage between search lines 204 (i.e., $SL_{high}$ and $SL_{low}$) will mainly drop across the M1 memristor, resulting in a small gate voltage G1 on transistor T2 that is less than a threshold voltage of T2 and insufficient to turn on the pull-down transistor T2. Because T2 does not turn on, it does not discharge the match line 206. Alternatively, if $V_{DL1}$ is smaller than the threshold voltage of transistor T1, then T1 remains in a high resistance, non-conductive state. As a result, the search voltage between search lines 204 (i.e., $SL_{high}$ and $SL_{low}$) will drop across transistor T1 and memristor M1, causing a gate voltage G1 on transistor T2 that is larger than the threshold voltage of T2, thereby turning on the pull-down transistor T2 and leading to the discharge of the match line 206. In this manner, the divider sub-circuit 212 enforces the lower bound of the stored range in the aCAM cell 200 by discharging the match line 206 (thereby indicating a mismatch) for any $V_{DL}$ that is less than (or less than or equal to) the lower voltage bound f(Gm') established by the conductance $G_{M1}$ of the memristor M1.

The divider sub-circuit 214 similarly enforces the upper bound of the stored range in the aCAM cell 200 by discharging the match line 206 (thereby indicating a mismatch) for any $V_{DL}$ that is greater than (or greater than or equal to) the upper voltage bound $f(G_{M2})$ established by the conductance $G_{M2}$ of the memristor M2. More specifically, if $V_{DL2}$ is less than a threshold voltage of transistor T3, then T3 remains in a high resistance, non-conductive state. As a result, the search voltage between search lines 204 will drop across transistor T3 as well as memristor M2, causing a high voltage to be supplied to the inverter (transistors T4 and T5 together). The inverter inverts the high voltage causing a low gate voltage G2 to be applied to the pull-down transistor T6. This low gate voltage G2 is smaller than the threshold voltage of T6, and thus, insufficient to turn on the transistor T6. Because T6 does not turn on, it does not discharge the match line 206. Conversely, if $V_{DL2}$ is larger than the threshold voltage of transistor T3, then transistor 13 turns on and remains in a highly conductive state. As a result, the search voltage between search lines 204 will mainly drop across the M2 memristor, resulting in a small voltage being supplied to the inverter. The inverter inverts this small voltage to a high gate voltage G2 that is larger than the threshold voltage of pull-down transistor T6, thereby turning on transistor T6 and causing it to discharge the match line 206.

Thus, in summation, the aCAM cell 200 keeps the match line 206 high only when $V_{DL}$ is within a certain range as defined by the M1 and M2 conductances, that is, when $f(G_{M1}) < V_{DL} < f(G_{M2})$. In some example embodiments, the match line 206 may also be kept high if $f(G_{M1}) = V_{DL}$ or $V_{DL} = f(G_{M2})$. Thus, the analog voltage range 210 bounded by $f(G_{M1})$ and $f(G_{M2})$ is a matching voltage range for the aCAM cell 200. In other words, the aCAM cell 200 determines that a search input value matches the range of values stored in the aCAM cell 200 if the voltage ($V_{DL}$) to which the search input value is mapped is within the analog voltage range 210 bounded by $f(G_{M1})$ and $f(G_{M2})$. It should be appreciated that different ranges of values may be stored in different aCAM cells by tuning one or more of the conductances of the memristors 208 differently.

As previously noted, conductances $G_{M1}$ and $G_{M2}$ of the memristors M1 and M2, respectively, may be tuned to establish a lower voltage bound f(Gm') and an upper voltage bound $f(G_{M2})$ of the analog voltage range 210 given by $f(G_{M1}) \le V_{DL} \le f(G_{M2})$. More specifically, the lower voltage bound enforced by the aCAM cell 200 may be a function of the conductance of the memristor M1 as well as the threshold voltage $V_{TH}$ of the transistor T1 of the divider sub-circuit 212. In addition, the upper voltage bound may be a function of the conductance of the memristor M2 and the threshold voltage $V_{TH}$ of the transistor T1. In particular, in example embodiments, the matching analog voltage range 210 given by $f(G_{M1}) \le V_{DL} \le f(G_{M2})$ may be expressed more precisely as $G_{M1}*(V_{SLhigh}/V_{TH, ML}-1)/\beta + V_{TH} \le V_{DL} \le G_{M2}*(V_{SLhigh}/V_{TH, INV}-1)/\beta + V_{TH}$, where $V_{TH, ML}$ and $V_{TH, INV}$ are the threshold voltages of the pull-down transistor T2 of divider sub-circuit 212 and the inverter of divider sub-circuit 214, respectively. It should be appreciated that the above relationship may assume that the transistors are operating in the linear regime.

As previously noted, an aCAM cell is also configurable to store a "don't care" value. Thus, an aCAM is always capable of operating as a TCAM. For instance, the aCAM cell 200 may be configured to store a "don't care" value by tuning the respective conductances $G_{M1}$ and $G_{M2}$ of memristors M1 and M2 such that $f(G_{M1}) \le V_{DL,min}$ and $f(G_{M2}) \ge V_{DL,max}$. In particular, if the conductance $G_{M1}$ of memristor M1 is tuned such that the lower voltage bound $f(G_{M1})$ is forced below the minimum voltage that can be applied to the data line 202 ($V_{DL,min}$) and the conductance $G_{M2}$ of memristor M2 is tuned such that the upper voltage bound $f(G_{M1})$ is forced above the maximum voltage that can be applied to the data line 202 ($V_{DL,max}$), then any voltage $V_{DL}$ capable of being applied to the data line 202, which is bounded by $V_{DL,min}$ and $V_{DL,max}$, would also necessarily fall within the analog voltage range 210 bounded by $f(G_{M1})$ and $f(G_{M2})$, which by virtue of the relationships noted above, fully encompasses the range bounded by $V_{DL,min}$ and $V_{DL,max}$. Thus, regardless of the search input value, the voltage $V_{DL}$ to which the search input value is mapped would always be within the analog voltage range 210 bounded by $f(G_{M1})$ and $f(G_{M2})$, and thus, the aCAM cell 200 would match any search input value—the equivalent of storing a "don't care" value.

In addition to storing a don't care value, the aCAM cell 200 may be configured to support receiving a don't care value for a search input value. In example embodiments, a don't care value can be searched by applying different voltages on data lines DL1 and DL2. In particular, a very high voltage can be applied to DL1 and a very low voltage can be applied to DL2. This would result in pull-down transistors T2 and T6 always being turned OFF, which in turn, would result in the voltage on the match line 206 continuing to remain high, thereby indicating a match regardless of the value or range of values stored in the aCAM cell 200. In addition, in some example embodiments, the aCAM cell 200 may be configured to force a mismatch for a stored word by tuning the respective conductances $G_{M1}$ and $G_{M2}$ of memristors M1 and M2 such that $f(G_{M1})>f(G_{M2})$. In this example scenario, the aCAM cell 200 would produce a mismatch (thereby resulting in a mismatch for the entire stored word) regardless of the search input value received at the aCAM cell 200.

While the discussion above pertaining to FIG. 2 has focused on how the aCAM cell 200 can be configured to enable storing analog ranges of values, the aCAM cell 200 can also be configured to store discrete values, as previously noted. In example embodiments, storing a discrete value in the aCAM cell 200 is achieved through voltage quantization. More specifically, all voltages that are within a preconfigured range of a given voltage may be defined as being equivalent to the given voltage. For instance, all voltages that are within 0.1±0.4 may be defined as 0.1. In this manner, a discrete value that is searched (e.g., a discrete voltage applied to the data line 202) may return a match as long as it falls within a range predefined to be equivalent to the searched value, thereby providing a degree of noise tolerance.

Similar to digital CAMs, because several cells in a row are connected to the same match line (e.g., match line 206) in an aCAM, the match line outputs "high" only when each cell in the row matches its corresponding search input value. In contrast to digital CAMs, however, aCAMs have significantly higher memory density, as one aCAM cell (e.g., aCAM cell 200) can store multiple bits with only six transistors and two memristors, for example, while an SRAM cell stores a one bit value using ten transistors and a ternary bit value using sixteen transistors (in the case of a digital TCAM cell). Moreover, as previously noted, a single aCAM cell is capable of storing analog ranges of values thereby allowing the aCAM cell to search and match a wide range of analog inputs, which digital CAMs cannot do.

Figure 3A:
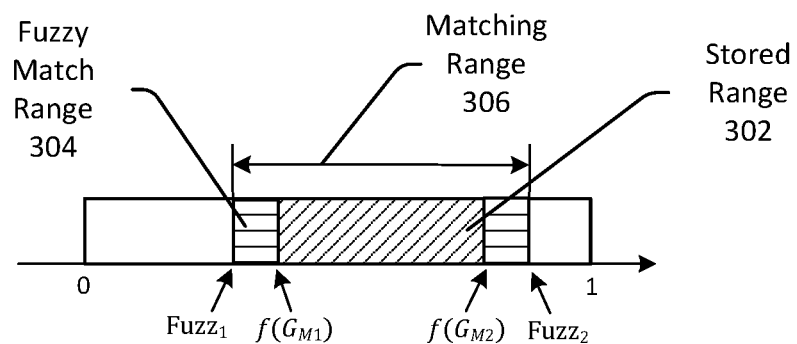
FIGS. 3A and 3B depict various combinations for storing an analog range of values in one or more cells of an aCAM and corresponding matching ranges associated with searching a value or a range of values against the stored range according to example embodiments of the invention.
Figure 3B:
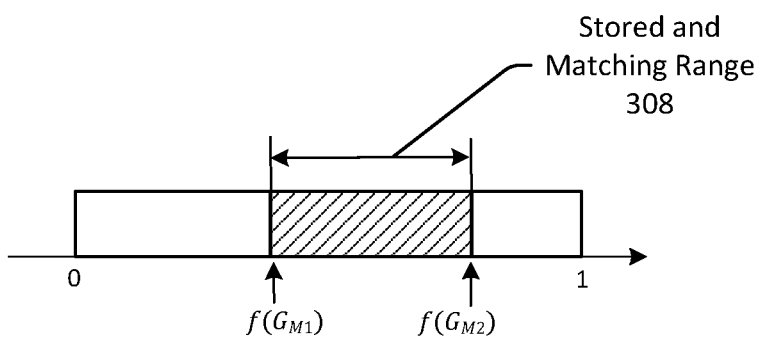

FIGS. 3A and 3B depict various ways in which a range of values can be stored in one or more cells of an aCAM and corresponding matching ranges associated with searching a value or a range of values against the stored range according to example embodiments of the invention. Various aCAM circuit configurations described in U.S. application Ser. Nos. 16/274,379, 16/744,136, or 16/526,455 may be employed to implement the various storage/search scenarios depicted in FIGS. 3A and 3B. FIGS. 3A and 3B depict example scenarios in which an ACAM cell stores an analog range of values. As previously described, an aCAM cell may store an analog range of values by tuning the respective conductances $G_{M1}$ and $G_{M2}$ of memristors M1 and M2 (FIG. 2) to obtain an analog voltage range defined by a lower voltage bound $f(G_{M1})$ and an upper voltage bound $f(G_{M2})$. In some example embodiments, the scenario of FIG. 3B involves searching an input value (e.g., a discrete numeric value) against the analog range of values 308 stored in the aCAM cell. This, in turn, involves determining whether a data line voltage $V_{DL}$ corresponding to the search input value is within an analog voltage range defined by a lower voltage bound $f(G_{M1})$ and an upper voltage bound $f(G_{M2})$ based on whether a match line to which the aCAM cell is connected remains at a high voltage (a high logic level) or is discharged to a low voltage (a low logic level). The aCAM cell 200 depicted in FIG. 2 is configurable, for example, to implement the scenario of FIG. 3B.

In the example scenario of FIG. 3B, the stored range of values may be the same as the matching range of values. In the example scenario of FIG. 3A, however, a fuzzy search capability may be provided, whereby the aCAM cell may search an input range of values against a stored range of values and output a match even if the search input range does not strictly correspond to the stored range. As previously described, an aCAM cell may store an analog range of values 302 by tuning the respective conductances $G_{M1}$ and $G_{M2}$ of memristors M1 and M2 (FIG. 2) to obtain an analog voltage range defined by a lower voltage bound $f(G_{M1})$ and an upper voltage bound $f(G_{M2})$. The aCAM cell may additionally provide a fuzzy search capability that expands a matching range 306 for the aCAM cell beyond the stored range 302 to include a fuzzy match range 304 as well. In this manner, even if an input search range of values does not exactly fall within the stored analog range 302, the aCAM cell may nonetheless output a match as long as the input search range falls within the larger matching range that also includes the fuzzy match range 304. A fuzzy match range 304 may be appended to one or both ends of the stored range 302 to produce the matching range 306. In example embodiments, the fuzzy match range 304 may be captured by the lower voltage bound $f(G_{M1})$ and the upper voltage bound $f(G_{M2})$ of the analog voltage range.

An example scenario in which the range/range matching of FIG. 3A may be applicable is in the case of avoiding competing concurrent writes to overlapping regions in connection with updates to fabric-attached memory. For example, if regions of active development are tracked, incoming requests can be checked against the outstanding requests and if a range/range match is found between a new request and an outstanding request, the new request can be queued until the outstanding request completes. It should be appreciated that the above example application scenario for range/range searching and matching is merely illustrative and not exhaustive.

Figure 4A:
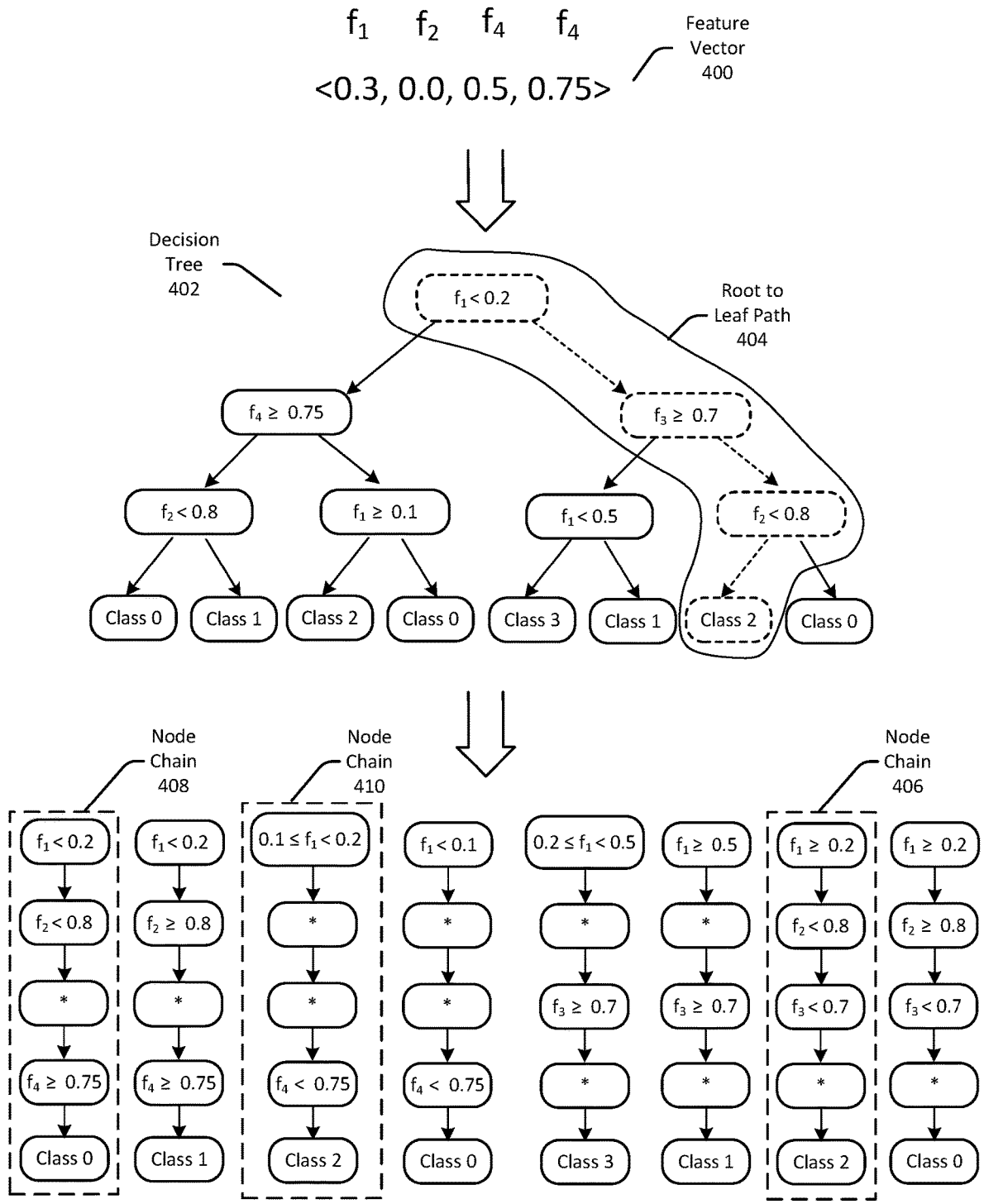
FIG. 4A is a flow diagram depicting conversion of a decision tree including a set of decision nodes that represent a set of logical rules to a tabular structure in which each logical rule is represented as a node chain in the tabular structure according to example embodiments of the invention.

FIG. 4A is a flow diagram depicting conversion of an example decision tree 402 including a set of decision nodes that correspond to evaluable conditions representative of a set of logical rules to a tabular structure in which each logical rule is represented as a node chain in the tabular structure according to example embodiments of the invention. The decision tree 402 is an example implementation of the decision tree 102 (FIG. 1). Similarly, the feature vector 400 is a more specific example of the generalized feature vector 100 (FIG. 1). The feature vector 400 may represent a search query that specifies the values 0.3, 0.0, 0.5, and 0.75 for the search variables $f_1$, $f_2$, $f_3$, and $f_4$, respectively. In other example embodiments, the values 0.3, 0.0, 0.5, and 0.75 may represent input voltages, each of which maps to a specific search input value. In such example embodiments, the evaluable conditions within root-to-leaf paths of the decision tree 402—which ultimately get converted to node chain representations and encoded in the aCAM 412—may actually reflect comparisons of an input data line voltage to a stored analog voltage range having lower and upper voltage bounds defined by the conductances of memristors within the cell of the aCAM that encodes that voltage range.

The root-to-leaf path 404 may be an example representation of the root-to-leaf path 110 (FIG. 1) and may include the same series of node transitions as the root-to-leaf path 110, specifically, $f_1$ condition 1b->$f_3$ condition 1b->$f_2$ condition 2a->Class 2. With respect to the specific evaluable conditions encoded in the decision tree 402, the series of node transitions for the root-to-leaf path 404 becomes: $f_1 \geq 0.2$->$f_3 < 0.7$->$f_2 < 0.8$->Class 2. As previously described in reference to the decision tree 102 (FIG. 1), each decision node in the decision tree 402 (other than the leaf nodes) is associated with an evaluable condition that can result in an 'a' outcome indicating that the evaluable condition is satisfied (which corresponds to the left branch extending from a decision node) or a 'b' outcome indicating that the evaluable condition is not satisfied (which corresponds to the right branch extending from the decision node). Thus, taking the evaluable condition ($f_1<0.2$) of the root node of the decision tree 402 as an example, the 'a' outcome is $f_1<0.2$ and the 'b' outcome is the result of the condition not being satisfied, that is, $f_1 \geq 0.2$.

As previously described in reference to FIG. 1, the decision tree 402 may be converted to a tabular representation. This involves, for example, converting each root-to-leaf path in the decision tree 402 to a corresponding node chain in the tabular representation. Converting a root-to-leaf path to a corresponding node chain may include consolidating two or more node transitions from the root-to-leaf path into a single node in the node chain; re-ordering node transitions in the root-to-leaf path to produce a node sequence in the corresponding node chain that is the same as the sequence of features/search variables in the feature vector 400; and/or generating nodes in the node chain that correspond to "don't care" values for features that are not evaluated in the root-to-leaf path.

For example, converting the root-to-leaf path 404 to the node chain 406 involves re-ordering the node transitions of the root-to-leaf path 404 to sequence the node representing the outcome of evaluating the condition for $f_2$ before the node representing the outcome of evaluating the condition for $f_3$ in the node chain 406. Converting the root-to-leaf path 404 to the node chain 406 further includes associating a "don't care" value with the node corresponding to feature $f_4$ because this feature is not evaluated in the root-to-leaf path 404. An example of consolidating node transitions of a root-to-leaf path is shown with respect to node chain 410. In particular, node chain 410 represents the root-to-leaf path in the decision tree 402 given by the following node transitions: $f_1<0.2 \rightarrow f_4<0.75 \rightarrow f_1 \geq 0.1 \rightarrow$ Class 0. The outcomes of evaluating the two conditions involving feature $f_1$ may then be consolidated into a single node in the node chain 410 representing the analog range 0.1 $f_1<0.2$. Converting the corresponding root-to-leaf path to the node chain 410 may further include re-ordering the node transition involving feature $f_4$ as well as associating a "don't care" value with feature $f_3$.

In example embodiments, each root-to-leaf path traversable in the decision tree 402 may be converted to a respective corresponding node chain in the tabular representation. In some embodiments, the decision tree 402 may be systematically traversed according to a predetermined traversal scheme to identify each root-to-leaf path, and the node chains may be generated and stored in the tabular representation in a same sequence as the root-to-leaf paths are traversed. For instance, the first root-to-leaf path identified in the decision tree 402 may be given by a series of node transitions representing an 'a' outcome at each node between the root node and the penultimate node of the root-to-leaf path, specifically, the following series of node transitions: $f_1<0.2 \rightarrow f_4 \geq 0.75 \rightarrow f_2<0.8 \rightarrow$ Class 0. This first root-to-leaf path traversal may then be converted to a first node chain 408 in the tabular representation. In other example embodiments, the sequence of the node chains in the tabular representation may not exactly correspond to the order in which the root-to-leaf paths are traversed in the decision tree 402 as long as each root-to-leaf path in the decision tree 402 is converted to a corresponding node chain in the tabular representation.

Figure 4B:
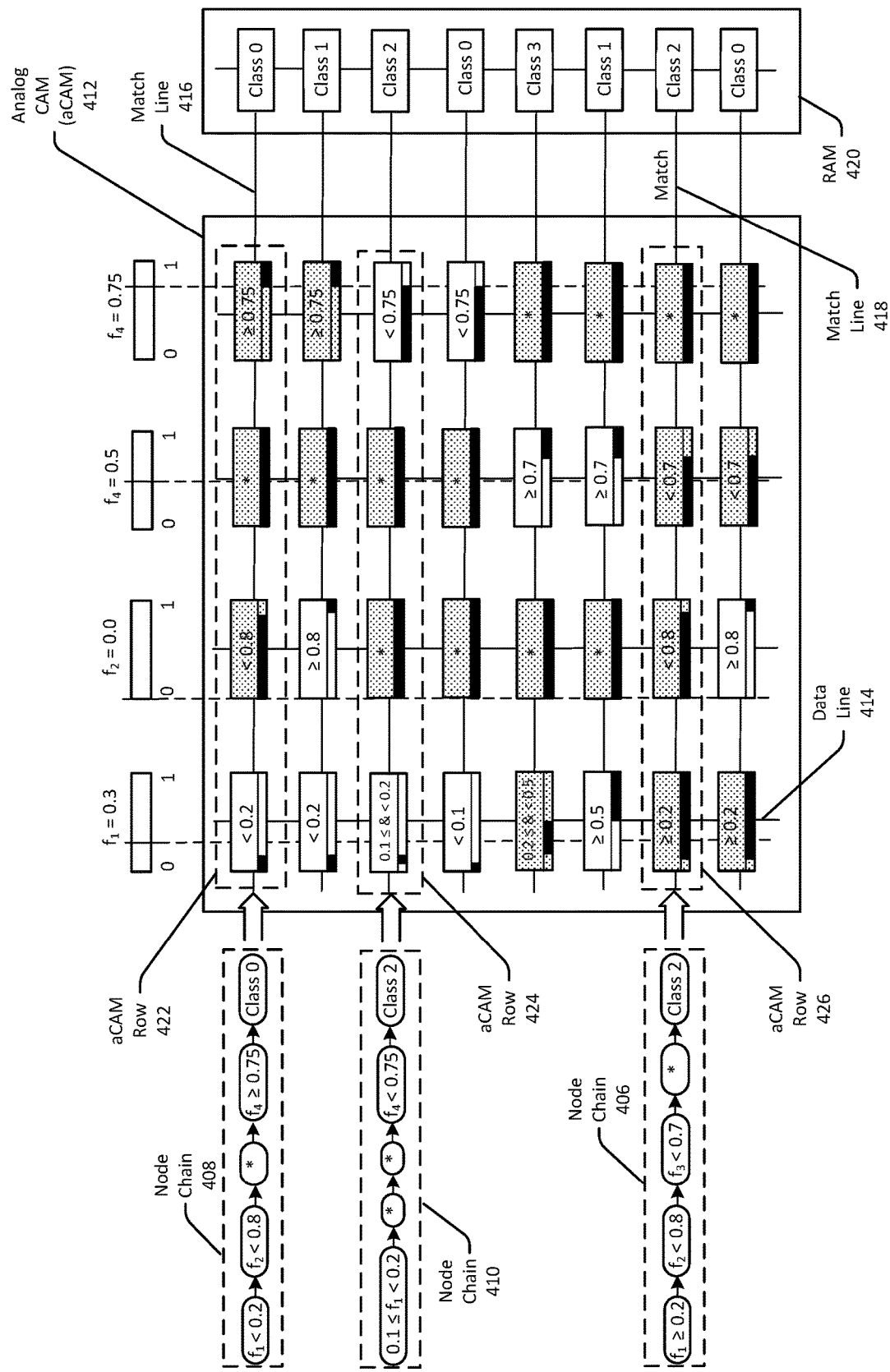
FIG. 4B depicts encoding of each node chain of the tabular structure of FIG. 4A in an aCAM according to example embodiments of the invention.

Referring now to FIG. 4B, an encoding of the set of node chains depicted in FIG. 4A in an aCAM 412 is depicted. The aCAM 412 includes multiple rows and columns of cells. In the specific example of FIGS. 4A and 4B, the aCAM 412 includes 4 columns of cells, with each column corresponding to a respective feature/search variable, and 8 rows of cells, with each row corresponding to a respective node chain, which in turn, corresponds to a respective node-to-leaf path in the decision tree 402. In example embodiments, each node chain may be rotated and encoded in the cells of a corresponding row of the aCAM 412. As previously described, each root-to-leaf path, and thus, each corresponding node chain represents a series of evaluable conditions constituting a logical rule such as a domain-related logical rule. After the domain logical rule embodied by the node chain is encoded in the aCAM 412, a search query containing set of search variable inputs (e.g., the feature vector 400) matches the encoded rule if the search variable inputs satisfy the respective evaluable conditions to which they correspond.

In example embodiments, while each row of the aCAM 412 is a stored word representing an encoded domain logical rule, each column of the aCAM 412 includes a collection of cells that stores values or ranges of values associated with evaluable conditions involving the same feature/search variable across the set of domain logic rules. For instance, the cells in the first column of aCAM 412 together store all of the ranges of analog values associated with evaluable conditions involving feature $f_1$ across the set of node chains (i.e., the set of domain logical rules). Similarly, the cells of the second column of the aCAM 412 store all of the ranges of analog values associated with evaluable conditions involving feature $f_2$ across the set of node chains, the cells of the third column of the aCAM 412 store all of the ranges of analog values associated with evaluable conditions involving feature $f_3$ across the set of node chains, and so forth. It should be appreciated that the re-ordering of the node transitions of a root-to-leaf path when converting the path to a node chain is done, at least in part, to ensure that the proper values are stored in the correct aCAM cells such that a search query can be efficiently searched and matched against each of the stored words in the aCAM 412 (i.e., each row) in parallel.

The encoding of some example node chains in the aCAM 412 is illustratively shown in FIG. 4B. As described earlier, each node chain includes a series of nodes that corresponds to a series of evaluable conditions that represent a particular root-to-leaf path in the decision tree 402. The example node chain 408, which includes the node sequence $f_1<0.2 \rightarrow f_2<0.8 \rightarrow * \rightarrow f_4 \geq 0.75 \rightarrow$ Class 0, is encoded in a first row 422 of the aCAM 412. Similarly, the example node chains 410, 406 are encoded in rows 424, 426, respectively, of the aCAM 412.

Taking the node chain 406 as an example, the analog range of values given by $f_1 \geq 0.2$ is encoded in a corresponding cell of the first column of the aCAM 412. In particular, this analog range of values may be encoded by tuning the conductances of the memristors of the aCAM cell to establish a matching voltage range for the aCAM cell that represents the analog range of values. The matching voltage range may be bounded by a lower voltage bound that is a function of the respective conductance $G_{M1}$ of a memristor M1 in the aCAM cell and that maps to the value 0.2 (or is the value 0.2) and by an upper voltage bound that is a function of the respective conductance $G_{M2}$ of a memristor M2 in the aCAM cell. The conductance $G_{M2}$ may be tuned such that the upper voltage bound given by $f(G_{M2})$ is above a maximum line voltage that can be applied to the data line 414, which is connected to each of the cells in the first column of the aCAM 412. In this manner, any search input value for feature $f_1$ that is greater than or equal to 0.2 (or that maps to a data line voltage greater than or equal to 0.2) would result in a match for that aCAM cell.

As another non-limiting example, the second evaluable condition $f_2<0.8$ in the node chain 406 is encoded in a corresponding cell in a second column of the aCAM 412. This analog range of values may be encoded by tuning conductances of memristors of the aCAM cell to establish a matching voltage range bounded by a lower voltage bound and an upper voltage bound, where the upper voltage bound is a function of the respective conductance $G_{M2}$ of a memristor M2 in the aCAM cell that maps to the value 0.8 (or is the value 0.8). The respective conductance $G_{M1}$ of memristor M1 in the aCAM cell may be tuned such that the lower voltage bound given by $f(G_{M1})$ is below a minimum line voltage that can be applied to a data line connected to each of the cells in the second column of the aCAM 412. In this manner, any search input value for feature $f_2$ that is less than 0.8 would result in a match for that aCAM cell.

In addition, various "don't care" values in the various node chains may be encoded in corresponding cells of the aCAM 412. For instance, encoding the node chain 406 in row 426 of the aCAM 412 includes encoding a "don't care" value in the aCAM cell in the fourth column of the aCAM 412 that corresponds to feature $f_4$, for which there is no corresponding evaluable condition in the node chain 406. In example embodiments, a "don't care" value is encoded in an aCAM cell by tuning the respective conductances $G_{M1}$ and $G_{M2}$ of memristors M1 and M2, respectively, to establish a matching voltage range for the cell that is bounded by a lower voltage bound $f(G_{M1})<V_{DL,min}$ and an upper voltage bound $f(G_{M2})>V_{DL,max}$. In this manner, any data line voltage supplied to the aCAM cell—which must be between $V_{DL,min}$ and $V_{DL,max}$—would necessarily also fall between the lower and upper voltage bounds. Thus, any input search value would result in a match for an aCAM cell that encodes a "don't care" value.

In some example embodiments, the final nodes in the node chains—which represent the leaf nodes in the decision tree 402, for example—may be stored in a memory array such as RAM 420 that is separate from the aCAM 412. This may allow for multiple match results to be returned for search queries that seek to optimize a particular feature/parameter/variable (e.g., the parameter represented by the last node in each node chain). For instance, the "class" parameter values stored in the RAM 420 may represent different connection times in the flight travel search application scenario mentioned earlier or different product costs in the product search scenario mentioned earlier. In some example embodiments, the analog, range, and/or fuzzy search capabilities of the aCAM 214 may be used to search the set of domain-related logical rules for some optimization criterion. That is, the various search capabilities of the aCAM 214 can be leveraged to find rules (e.g., stored words in the aCAM 214) that include a set constrained variables, and optionally, one or more free (i.e., "don't care") variables, and that yield a minimum, maximum, or otherwise optimized value for another variable/parameter.

In example embodiments, a search query represented by the feature vector 400 (<0.3, 0.0, 0.5, 0.75>) may be inputted to the aCAM 412. The following description of the process of searching and matching the query against the stored contents of the aCAM 412 assumes, for ease of explanation, that the values of the feature vector 400 represent input data line voltages that map to corresponding search variable values specified in a search query, and further assumes that the numeric values to which feature vector values are compared as part of the example evaluable conditions are lower and upper voltage bounds of stored analog voltage ranges that represent the evaluable conditions. While the example feature vector 400 includes only discrete values, it should be appreciated that an input search variable may be an analog range of values, in which case, the value in the feature vector 400 that corresponds to that input search variable may be an analog voltage range that maps to the analog range of values.

In example embodiments, the aCAM 412 may reside within a computing device. A processor of the computing device may execute machine-executable instructions to cause a low latency, parallel search of the aCAM 412 to be performed based on the search query. The parallel search may include searching the input feature vector 400 against each row in the aCAM 412 in parallel. In example embodiments, searching the input feature vector 400 against a given aCAM row includes comparing the value specified for each feature against the stored value or range of values in a corresponding cell of the aCAM row. If (and only if) each feature value equals a stored value or is within a stored range of values of a corresponding aCAM cell, the aCAM outputs a match for the stored word represented by that aCAM row. A match may be outputted for a given stored word if a voltage on a corresponding match line corresponds to a high logic level (which may be represented by a low voltage or a high voltage on the match line depending on the implementation). A match for a particular stored word indicates that the feature vector 400 satisfies the evaluable conditions associated with the domain logical rule represented by that stored word. If, on the other hand, at least one feature value does not equal a stored value or is not within a stored analog range of values of a corresponding aCAM cell, that cell may discharge a match line, thereby indicating a mismatch for that stored word.

For example, comparing the input feature vector 400 (<0.3, 0.0, 0.5, 0.75>) to the stored word encoded at row 426 of the aCAM 412 results in a match because each input search value in the feature vector 400 satisfies the condition embodied in a corresponding cell of the aCAM row 426. More specifically, the input search value for $f_1$ satisfies the evaluable condition embodied in the first aCAM cell in row 426 ($f_1 \geq 0.2$) if the input search value falls within an analog range of values that represents the evaluable condition and that is stored in the first aCAM cell in row 426. In example embodiments, in the case of the evaluable condition $f_1 \geq 0.2$, a match occurs as long the data line voltage to which the input search variable value specified for feature $f_1$ maps is within a stored analog voltage range bounded by a lower voltage bound of 0.2 and an upper voltage bound greater than a maximum data line voltage. Thus, as long as the voltage applied on the data line is at least 0.2 or larger, the aCAM cell will not discharge the match line, thereby indicating a match for that aCAM cell. The other aCAM cells of row 426 also indicate a match (i.e., do not discharge the match line) because $f_2=0.0<0.2$; $f_3=0.5<0.7$; and $f_4=0.75$ is between 0 and 1. In fact, the aCAM cell in row 426 that corresponds to feature f4 always outputs a match because it stores a "don't care" value in the form of an analog voltage range that encompasses any possible data line voltage that may be applied. Because each aCAM cell in row 426 matches the corresponding feature value in the feature vector 400, no aCAM cell in row 426 discharges the match line 418, thereby maintaining the match line 418 at the high logic level that is indicative of a matching result.

In example embodiments, the address of the stored word at row 426 in the aCAM 412 may be returned. In some example embodiments, the "class" variable may be a parameter that a user seeks to optimize, in which case, the stored word at aCAM row 426 would only be returned as a matching result for the feature vector 400 if the corresponding value for the class parameter (i.e., class 2) satisfies the value for the optimized parameter specified in the search query. For example, if the class parameter represents total product cost that a user seeks to minimize in a product search application scenario, the combination of product parameters represented by aCAM row 426 would be returned as a matching result if the corresponding value stored for the total product cost parameter is less than a maximum allowable value specified in the search query.

In the example of FIGS. 4A and 4B, the feature vector 400 only produces a matching result for the stored word at aCAM row 426. The feature vector 400 results in a mismatch for each other stored word. In FIG. 4B, an aCAM cell that produces a match for a corresponding feature value in the feature vector 400 is depicted with shading. As can be seen in FIG. 4B, aCAM row 426 is the only stored word for which each aCAM cell in the row 426 is shown with shading, thereby indicating a match. For each other stored word in the aCAM 412, at least one feature value specified in the feature vector 400 does not produce a match with respect to a corresponding aCAM cell. For instance, the feature vector 400 produces a match for the aCAM cells in the second, third, and fourth columns of the aCAM 412. The feature vector 400, however, results in a mismatch with respect to feature $f_1$. In particular, the analog voltage range bounded by a lower bound of 0 and an upper bound of 0.2 that is encoded in the first aCAM cell of row 422 does not include $f_1=0.3$. This results in a pull-down transistor of the aCAM cell turning on and discharging the match line 416, thereby indicating a mismatch for the stored word at row 422. Each other stored word in the aCAM 412 (other than the stored word at row 426) produces a mismatch for the feature vector, including the stored word at row 424, which produces a match for the stored don't care values for features $f_2$ and $f_3$, but a mismatch with respect to the stored analog ranges of values for features $f_1$ and $f_4$.

Figure 5:
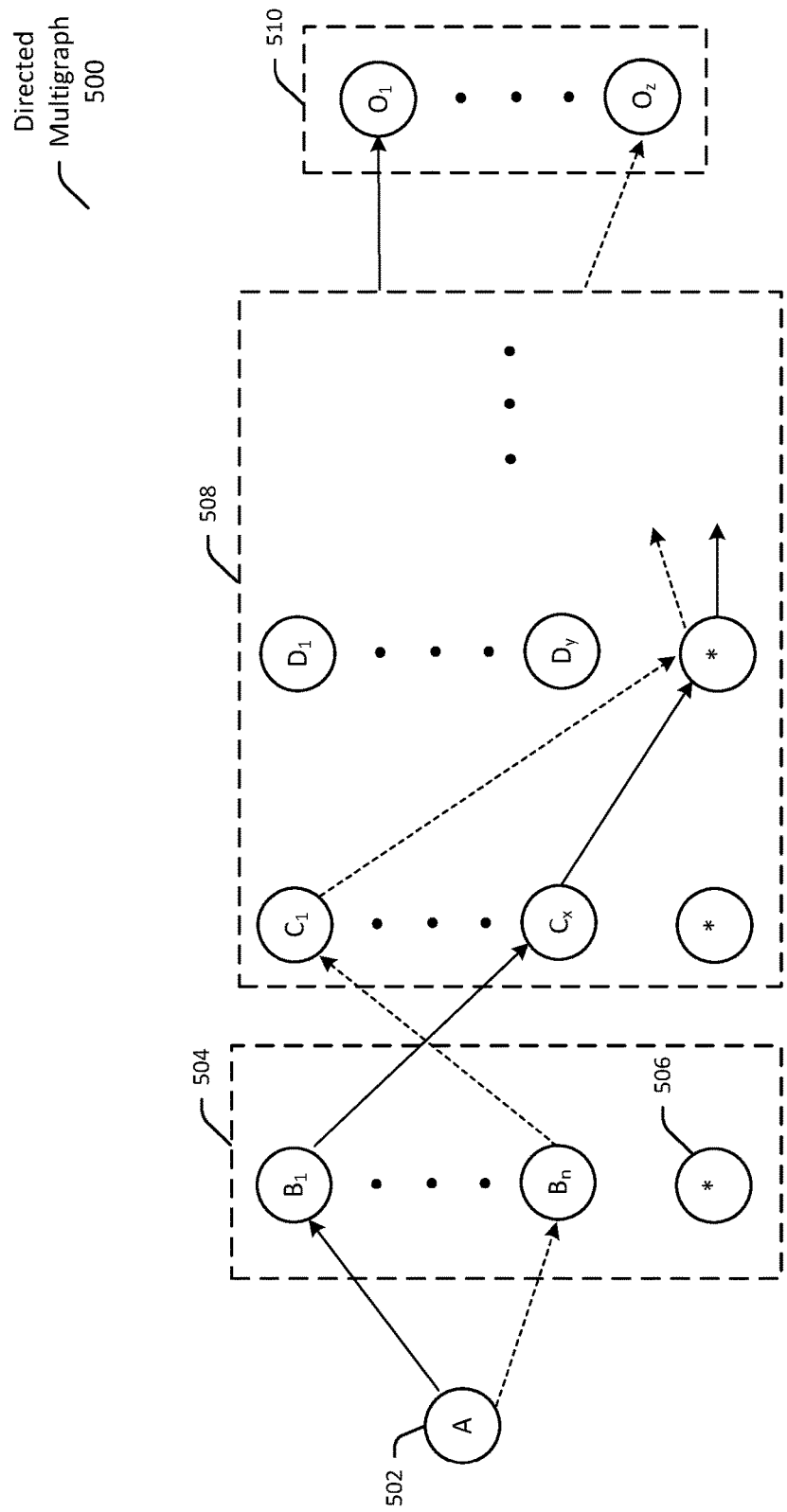
FIG. 5 is a generalized directed multigraph representing a set of logical rules according to example embodiments of the invention.

FIG. 5 is a generalized directed multigraph 500 representing a set of logical rules according to example embodiments of the invention. The directed multigraph 500 may be an alternative data structure to the decision tree 402 for representing a set of domain logical rules. The directed multigraph 500 is a graph that includes a collection of nodes and a collection of edges that define relationships between various nodes, where the graph is permitted to have parallel edges—edges that share the same end node. In example embodiments, each edge may have its own identity. This property allows for a domain logical rule to be represented in the directed multigraph as a series of node transitions along a particular set of edges.

In example embodiments, the directed multigraph 500 may include a root node 502. The directed multigraph 500 may further include a set of nodes 504 that includes nodes that represent the set of candidate values $\{B_1, \ldots, B_n\}$ that a first search variable can take on as well as a node representing a don't care value 506. The set of candidate values $\{B_1, \ldots, B_n\}$ may include categorical values, numeric values, analog continuous ranges of values, or the like. The directed multigraph may similarly include one or more additional groupings of nodes 508, where each additional grouping of nodes includes nodes that represent a set of candidate values (e.g., $\{C_1, \ldots, C_x\}$ or $\{D_1, \ldots, D_y\}$) that a corresponding search variable can take on as well as a node representing a don't care value. Finally, the directed multigraph 500 may include a set of nodes 510 that is representative of a set of candidate values $\{O_1, \ldots, O_z\}$ that a search variable/parameter can take on, such as a parameter that is optimized. It should be appreciated that any of the sets of candidate values that search variables can take on (e.g., $\{C_1, \ldots, C_x\}$, $\{D_1, \ldots, D_y\}$, $\{O_1, \ldots, O_z\}$, etc.) may include categorical values, numeric values, analog continuous ranges of values, or the like. It should be further appreciated that different characters n, x, y, and z are used in FIG. 5 to illustrate that different search variables may be able to take on different numbers of discrete values and/or ranges of values.

In example embodiments, a path that traverses the directed multigraph 500, transitioning from node to node via a particular set of directed edges, may represent a domain logical rule that includes a series of evaluable conditions relating to one or more search variables. More specifically, a path traversed through the directed multigraph 500 may include a series of discrete values or ranges of values against which corresponding input search values or ranges of values are compared to determine if the input satisfies the domain logical rule represented by the traversed path. For example, the series of node transitions depicted using solid arrows is a traversal path through the directed multigraph 500 that represents a particular domain logical rule and the series of node transitions depicted using dashed arrows is another traversal path through the directed multigraph 500 that represents another domain logical rule.

Figure 6:
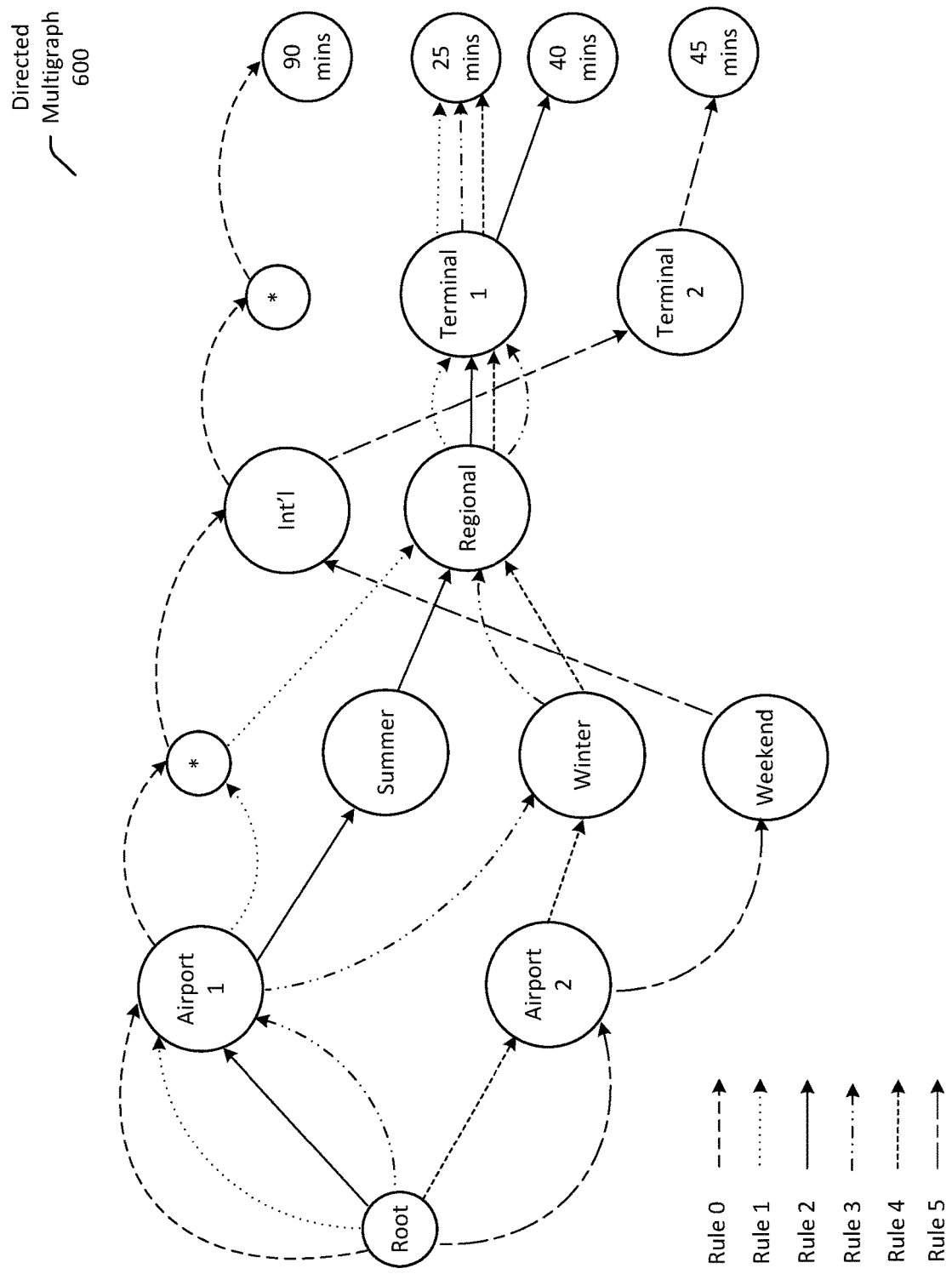
FIG. 6 is an example directed multigraph representing a set of domain-related logical rules according to example embodiments of the invention.

FIG. 6 is an example directed multigraph 600 representing a set of domain-related logical rules according to example embodiments of the invention. FIG. 6 relates to the air travel search application scenario introduced before. In the example directed multigraph 600, various candidate values that various search variables can take on are shown. For instance, "Airport 1" and "Airport 2" may be candidate values for an "airport" search variable. Similarly, "Summer," "Winter," and "Weekend" may be candidate values for a "flight timeframe" search variable; "International" and "Regional" may be candidate values for a "flight type" search variable; "Terminal 1" and "Terminal 2" may be candidate values for a "terminal" search variable; and the various time durations may be candidate values for a "minimum connection time" search variable. In example embodiments, the "connection time" search variable may be a parameter that a user seeks to optimize. It should be appreciated that while example candidate values are shown for various search variables in FIG. 6, any of the search variables may include additional candidate values beyond those specifically depicted. Further, while the candidate values are shown as being discrete values, it should be appreciated that one or more search variables may take on analog ranges of values. For instance, a "total flight time" search variable may take a range of values bounded by a minimum flight time (e.g., a tailwind scenario) and a maximum flight time (e.g., a headwind scenario). Moreover, any of the search variables may also take on the don't care value.

In example embodiments, a set of domain-related logical rules may be represented by corresponding path traversals through the directed multigraph 600. These rules may be encoded in an aCAM using previously described techniques. For instance, traversal paths through the directed multigraph 600 may be identified. Then, the particular combination of values/ranges of values associated with each traversal path and corresponding domain logical rule may be encoded in a respective row of an aCAM. For instance, Rule 0 may include the following series of node transitions representing a particular combination of values for the search parameters: Airport 1->*->Intl->*->90 mins. In this example domain logical rule, the "flight timeframe" and "terminal" search parameters are don't care values that would match against any input search value specified for those search parameters. This combination of values may be stored in an aCAM row, thereby encoding Rule 0 in the aCAM. As another non-limiting example, Rule 2 may include the following series of node transitions representing another particular combination of values for the search parameters: Airport 1->Summer->Regional->Terminal 1->25 mins. This domain logical rule does not include any flexible don't care values. This combination of values may be stored in an aCAM row, thereby encoding Rule 2 in the aCAM. Each other domain logical rule may be similarly encoded in the aCAM.

In example embodiments, various search queries may be provided as input to an aCAM that encodes the set of domain logical rules represented in the directed multigraph 600. For search queries that match an encoded rule (i.e., a stored word in the aCAM that embodies the encoded rule), an address of the stored word in the aCAM may be returned. In some example embodiments, a search query may seek to optimize the "minimum connection time" parameter, and as such, may specify a value for this parameter that serves as an upper bound for match results. If, however, the value specified for the "minimum connection time" parameter in the search query is too large (e.g., 90 mins), then too many match results may be returned (e.g., every stored word in the aCAM representing every domain logical rule would match because every such rule corresponds to a minimum connection time that is less than equal to 90 mins). Conversely, if the value specified for the "minimum connection time" in the search query is too small (e.g., 20 mins), then there may be no matching results. In example embodiments, the value specified for the parameter to be optimized (e.g., minimum connection time) may be iteratively adjusted, either up or down as the case may be, in order to obtain a desired and manageable number of match results.

Figure 7:
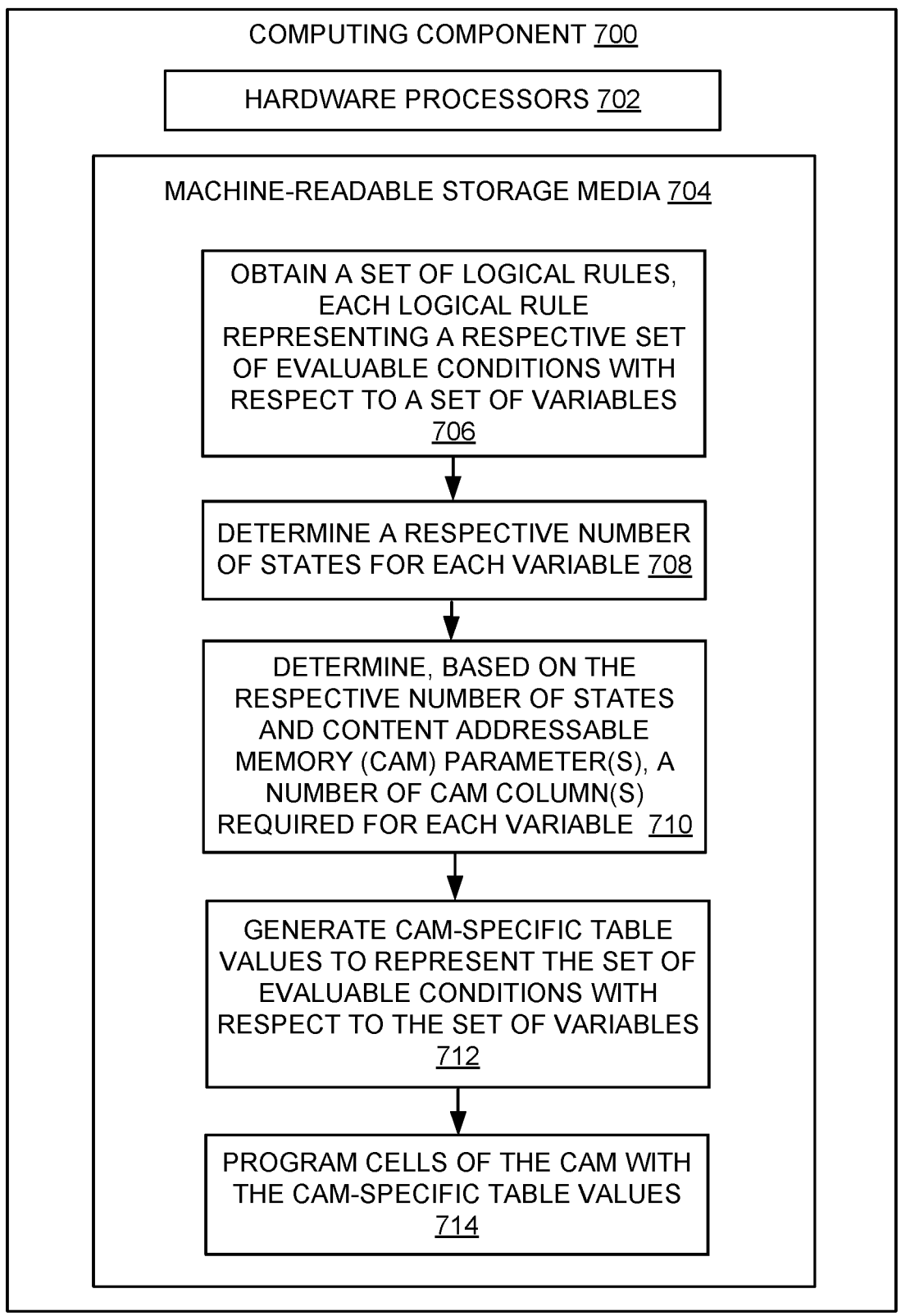
FIG. 7 depicts a set of executable instructions stored in machine-readable storage media that, when executed, cause one or more hardware processors to perform an illustrative method for encoding a set of logical rules in an aCAM according to example embodiments of the invention.

FIG. 7 depicts a computing component 700 that includes one or more hardware processors 702 and machine-readable storage media 704 storing a set of machine-readable/machine-executable instructions that, when executed, cause the hardware processors 702 to perform an illustrative method for encoding a set of logical rules in an aCAM according to example embodiments of the invention. The computing component 700 may be, for example, the computing system 900 depicted in FIG. 9. The hardware processors 702 may include, for example, the processor(s) 904 depicted in FIG. 9 or any other processing unit described herein. The machine-readable storage media 704 may include the main memory 906, the read-only memory (ROM) 908, the storage 910, and/or any other suitable machine-readable storage media described herein.

At block 706, the hardware processor(s) 702 may execute machine-readable/machine-executable instructions stored in the machine-readable storage media 704 to obtain a set of logical rules. In example embodiments, each logical rule represents a respective of evaluable conditions with respect to a set of variables. For instance, each logical rule may be a domain-related logical rule such as a particular combination of values and/or range of values for the set of variables.

At block 708, the hardware processor(s) 702 may execute machine-readable/machine-executable instructions stored in the machine-readable storage media 704 to determine a respective number of states for each variable. In example embodiments, the respective number of states for a given search variable/parameter may be the set of candidate values/ranges of values (including a don't care value) that the search variables can take on.

At block 710, the hardware processor(s) 702 may execute machine-readable/machine-executable instructions stored in the machine-readable storage media 704 to determine, based on the respective number of states and one or more parameters of an aCAM, a number of columns required to store values/ranges of values for each search variable. In particular, the number of aCAM columns required for a given search variable may vary based on the number of bits that can be stored by an aCAM cell and the number of candidate values/ranges of values the search variable can take on.

At block 712, the hardware processor(s) 702 may execute machine-readable/machine-executable instructions stored in the machine-readable storage media 704 to generate aCAM-specific table values to represent the set of evaluable conditions with respect to the set of variables. More specifically, in some example embodiments, a tabular representation including a set of node chains such as that depicted in FIGS. 1 and 4A may be generated, where each node chain represents a corresponding logical rule.

Finally, at block 714, the hardware processor(s) 702 may execute machine-readable/machine-executable instructions stored in the machine-readable storage media 704 to program the cells of the aCAM with the CAM-specific table values. In this manner, the set of logical rules are encoded in the aCAM.

Figure 8:
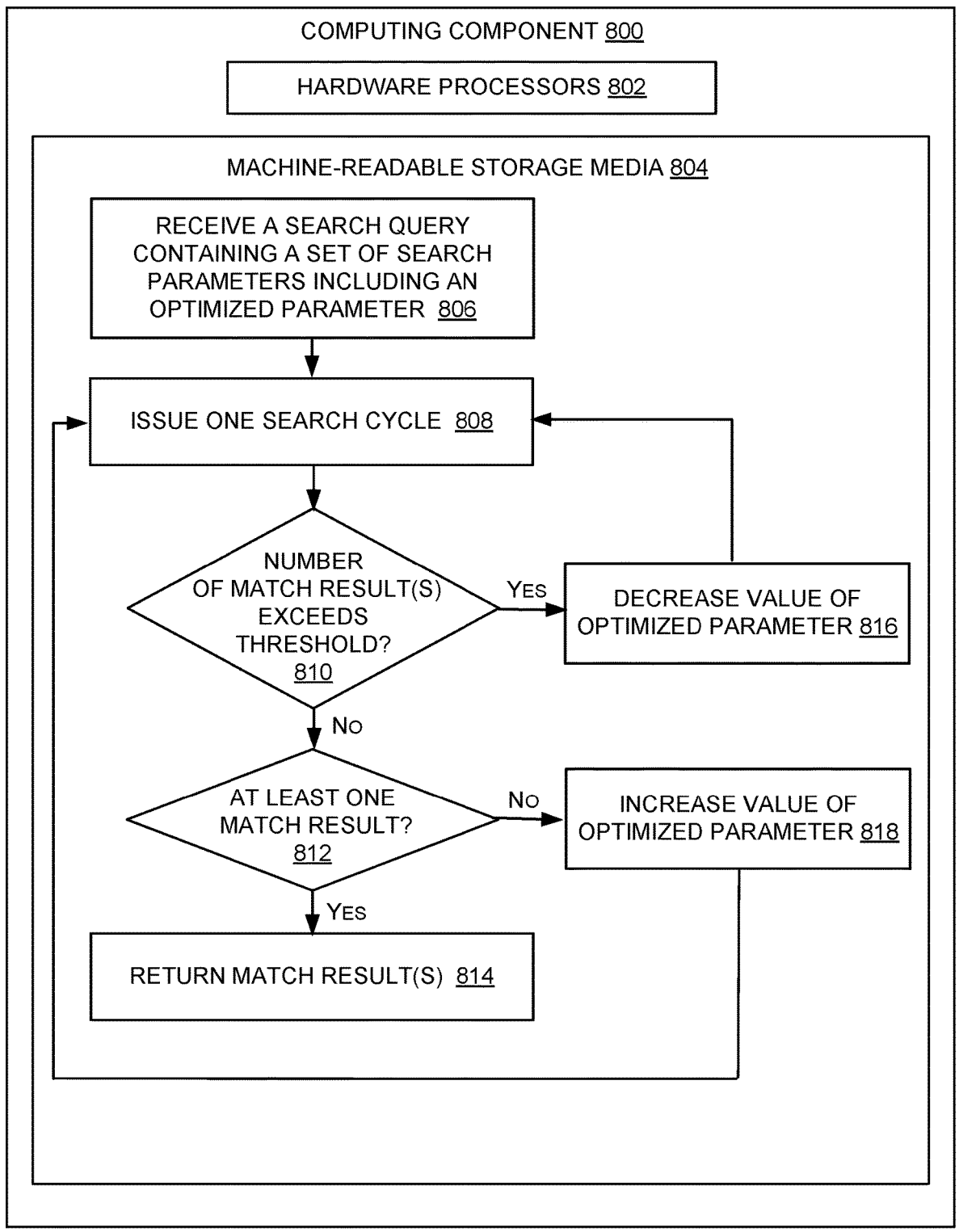
FIG. 8 depicts a set of executable instructions stored in machine-readable storage media that, when executed, cause one or more hardware processors to perform an illustrative method for iteratively adjusting an optimized search parameter in connection with a flexible search query executed by an aCAM that encodes a set of logical rules according to example embodiments of the invention.

FIG. 8 depicts a computing component 800 that includes one or more hardware processors 802 and machine-readable storage media 804 storing a set of machine-readable/machine-executable instructions that, when executed, cause the hardware processors 802 to perform an illustrative method for iteratively adjusting an optimized search parameter in connection with a flexible search query executed by an aCAM that encodes a set of logical rules according to example embodiments of the invention. The computing component 800 may be, for example, the computing system 900 depicted in FIG. 9. The hardware processors 802 may include, for example, the processor(s) 904 depicted in FIG. 9 or any other processing unit described herein. The machine-readable storage media 804 may include the main memory 906, the read-only memory (ROM) 908, the storage 910, and/or any other suitable machine-readable storage media described herein.

At block 806, the hardware processor(s) 802 may execute machine-readable/machine-executable instructions stored in the machine-readable storage media 804 to receive a search query. The search query may include one or more values specified for one or more constrained search parameters. The search query may optionally include a don't care value for one or more flexible search parameters. In addition, the search query may specify a value for a parameter for which optimization is sought. The optimized parameter may be, for example, minimum connection time or total product cost in the example application scenarios discussed earlier.

At block 808, the hardware processor(s) 802 may execute machine-readable/machine-executable instructions stored in the machine-readable storage media 804 to issue a search cycle during which the content of an aCAM may be searched in parallel based on the received search query.

At block 810, the hardware processor(s) 802 may execute machine-readable/machine-executable instructions stored in the machine-readable storage media 804 to determine whether a number of match results obtained from the search cycle exceed a threshold number of results (a "too many" match results scenario). In response to a positive determination at block 810, the hardware processor(s) 802 may, at block 816, execute machine-readable/machine-executable instructions stored in the machine-readable storage media 804 to decrease the value of the optimized parameter. In some example embodiments, a user may be prompted to resubmit the search query updated to include the decreased value for the optimized parameter. In other example embodiments, the value of the optimized parameter may be decreased by a preconfigured amount based on an automated algorithm. The method may then return again to block 808.

In response to a negative determination at block 810, the hardware processor(s) 802 may, at block 812, execute machine-readable/machine-executable instructions stored in the machine-readable storage media 804 to determine if there is at least one match result from the search cycle issued at block 808. In response to a positive determination at block 812, the hardware processor(s) 802 may, at block 814, execute machine-readable/machine-executable instructions stored in the machine-readable storage media 804 to return the at least one match result.

On the other hand, in response to a negative determination at block 812, the hardware processor(s) 802 may, at block 818, execute machine-readable/machine-executable instructions stored in the machine-readable storage media 804 to increase the value of the optimized parameter. In some example embodiments, a user may be prompted to resubmit the search query updated to include the increased value for the optimized parameter. In other example embodiments, the value of the optimized parameter may be decreased by a preconfigured amount based on an automated algorithm. The method may then return again to block 808.

In example embodiments, the illustrative method depicted in FIG. 8 may proceed iteratively until one or more match results are returned that do not exceed a maximum threshold number of desired results. In some example embodiments, if the number of match results is too large because the optimized parameter value is too large, the optimized parameter value may be iteratively decreased until a single, optimal solution is obtained. As a non-limiting example, if the optimized parameter is minimum connection time, the value specified for this parameter in a search query may be iteratively decreased until an optimal solution is obtained that results in a minimized minimum connection time.

Figure 9:
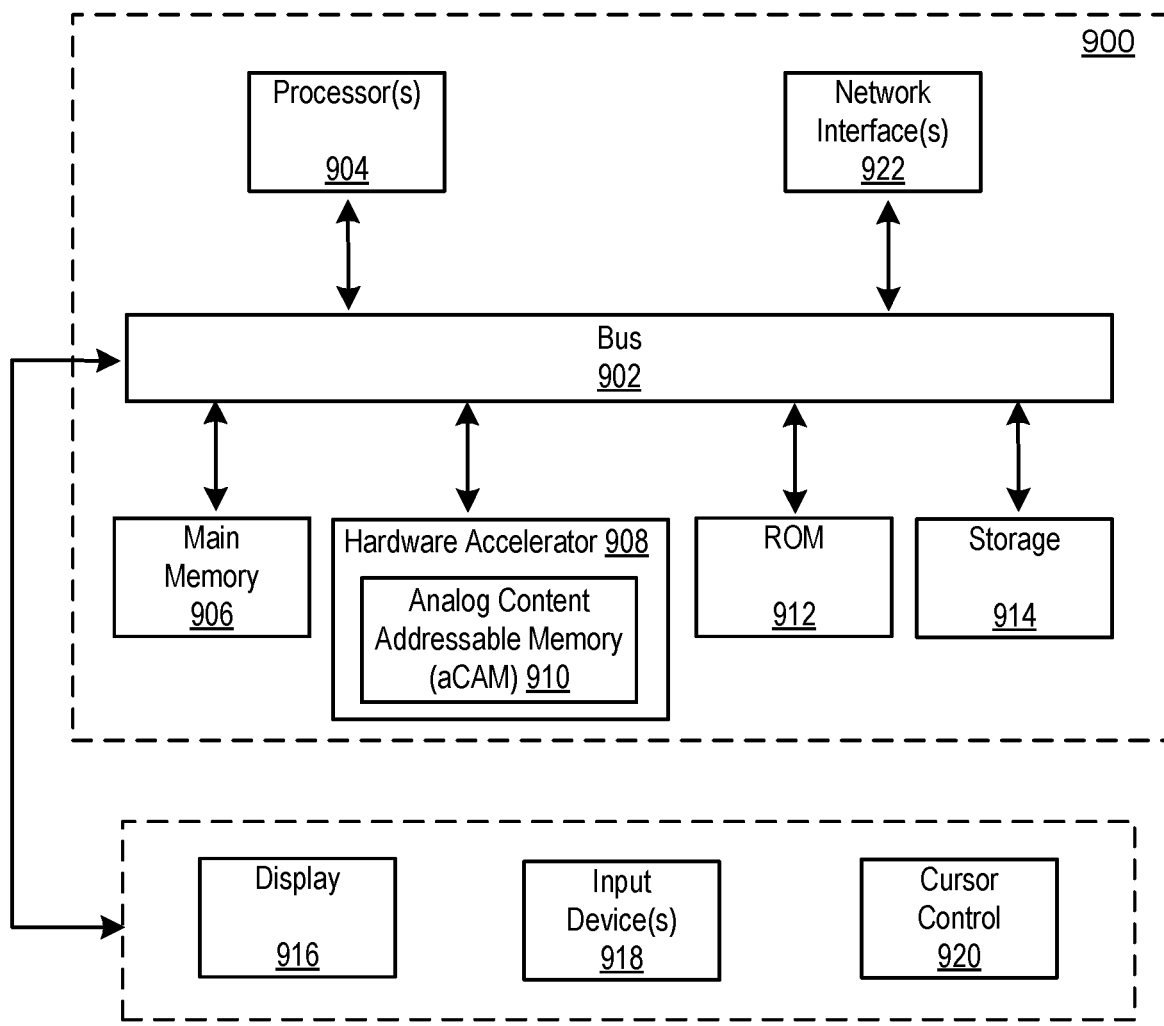
FIG. 9 is an example computing component that may be used to implement various features of example embodiments of the invention.

FIG. 9 depicts a block diagram of an example computer system 900 in which various of the embodiments described herein may be implemented. The computer system 900 includes a bus 902 or other communication mechanism for communicating information, one or more hardware processors 904 coupled with bus 902 for processing information. Hardware processor(s) 904 may be, for example, one or more general purpose microprocessors.

The computer system 900 also includes a main memory 906, such as a random access memory (RAM), cache and/or other dynamic storage devices, coupled to bus 902 for storing information and instructions to be executed by processor 904. Main memory 906 also may be used for storing temporary variables or other intermediate information during execution of instructions to be executed by processor 904. Such instructions, when stored in storage media accessible to processor 904, render computer system 900 into a special-purpose machine that is customized to perform the operations specified in the instructions.

The computer system 900 additionally includes a hardware accelerator 908. The hardware accelerator 908 may be configured to execute instructions (i.e. programming or software code) stored in the main memory 906, read-only memory (ROM), and/or storage 914 to encode a set of logical rules embodied in a data structure (e.g., the decision tree 104) into an aCAM array 910. In an example implementation, the exemplary hardware accelerator 908 may include multiple integrated circuits, which in turn, can include Application-Specific Integrated Circuits (ASICs), Field Programmable Gate Arrays (FPGAs) or other Very Large Scale Integrated circuits (VLSIs). The integrated circuits of the exemplary hardware accelerator 908 may be specifically optimized to perform a discrete subset of computer processing operations, or execute a discrete subset of computer-executable instructions, in an accelerated manner. For example, hardware accelerator 908 may be configured or manufactured to implement a set of logical rules embodied in a data structure such as the decision tree 104 on the a-CAM array 910.

The a-CAM array 910 may include a non-volatile memory built using technologies that include for instance, resistive switching memory (i.e. memristor), phase change memory, magneto-resistive memory, ferroelectric memory, some other resistive random access memory device (Re-RAM), or combinations of those technologies. More generally, the aCAM array 910 may be implemented using technologies that permit the aCAM 910 to hold its contents even when power is lost or otherwise removed. Thus, data in the aCAM 910 "persists" and the aCAM 910 can act as what is known as a "non-volatile memory."

The computer system 900 further includes a read only memory (ROM) 912 or other static storage device coupled to bus 902 for storing static information and instructions for processor 904. A storage device 914, such as a magnetic disk, optical disk, or USB thumb drive (Flash drive), etc., is provided and coupled to bus 902 for storing information and instructions.

The computer system 900 may be coupled via bus 902 to a display 916, such as a liquid crystal display (LCD) (or touch screen), for displaying information to a computer user. An input device 918, including alphanumeric and other keys, is coupled to bus 902 for communicating information and command selections to processor 904. Another type of user input device is cursor control 920, such as a mouse, a trackball, or cursor direction keys for communicating direction information and command selections to processor 904 and for controlling cursor movement on display 916. In some embodiments, the same direction information and command selections as cursor control may be implemented via receiving touches on a touch screen without a cursor.

The computing system 900 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 900 may implement the techniques described herein using customized hard-wired logic, one or more ASICs or FPGAs, firmware and/or program logic which in combination with the computer system causes or programs computer system 900 to be a special-purpose machine. According to one embodiment, the techniques herein are performed by computer system 900 in response to processor(s) 904 executing one or more sequences of one or more instructions contained in main memory 906. Such instructions may be read into main memory 906 from another storage medium, such as storage device 910. Execution of the sequences of instructions contained in main memory 906 causes processor(s) 904 to perform the process steps described herein. In alternative embodiments, hard-wired circuitry may be used in place of or in combination with software instructions.

The term "non-transitory media," and similar terms such as machine-readable storage media, as used herein, refers to any media that store data and/or instructions that cause a machine to operate in a specific fashion. Such non-transitory media may comprise non-volatile media and/or volatile media. Non-volatile media includes, for example, optical or magnetic disks, such as storage device 910. Volatile media includes dynamic memory, such as main memory 906. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 902. Transmission media can also take the form of acoustic or light waves, such as those generated during radio-wave and infra-red data communications.

The computer system 900 also includes a communication interface 922 coupled to bus 902. Communication interface 922 provides a two-way data communication coupling to one or more network links that are connected to one or more local networks. For example, communication interface 922 may be an integrated services digital network (ISDN) card, cable modem, satellite modem, or a modem to provide a data communication connection to a corresponding type of telephone line. As another example, communication interface 922 may be a local area network (LAN) card to provide a data communication connection to a compatible LAN (or WAN component to communicate with a WAN). Wireless links may also be implemented. In any such implementation, communication interface 922 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical signals that carry digital data streams. The signals through the various networks and the signals on network link and through communication interface 922, which carry the digital data to and from computer system 900, are example forms of transmission media.

The computer system 900 can send messages and receive data, including program code, through the network(s), network link and communication interface 922. In the Internet example, a server might transmit a requested code for an application program through the Internet, the ISP, the local network and the communication interface 922.

The received code may be executed by processor 904 as it is received, and/or stored in storage device 910, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 900.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method, comprising:
    obtaining a set of logical rules, wherein each logical rule includes a respective set of evaluable conditions relating to a set of parameters;
    populating a data structure with a set of values, the set of values including a respective subset of values corresponding to each set of evaluable conditions, the set of values including at least one range of analog values;
    encoding the set of values in an analog content addressable memory (aCAM), wherein each row of the aCAM is a stored word that encodes the subset of values corresponding to the set of evaluable conditions of a respective logical rule;
    receiving a search query containing a search word comprising a respective parameter value for each parameter in the set of parameters, the search query further specifying a respective parameter value for an optimized parameter;
    searching the aCAM for the search word;
    determining a number of match results for the search word, wherein each match result corresponds to a respective stored word in the aCAM that outputs a match for each respective parameter value in the search query; and
    determining, based at least in part on the number of match results, whether to modify the respective parameter value for the optimized parameter to expand or contract the number of match results.

2. The method of claim 1, wherein the at least one range of analog values comprises a first range of analog values corresponding to a first evaluable condition of a first logical rule of the set of logical rules, the first evaluable condition relating to a first parameter of the set of parameters.

3. The method of claim 2, wherein the aCAM comprises a plurality of cells, and wherein encoding the set of values in the aCAM comprises encoding the first range of analog values in a first cell of the plurality of cells.

4. The method of claim 3, wherein the first cell comprises a first memristor and a second memristor, and wherein encoding the first range of analog values in the first cell of the plurality of cells comprises encoding in the first cell a first analog voltage range corresponding to the first range of analog values.

5. The method of claim 4, wherein encoding the first analog voltage range in the first cell comprises:
    setting a first conductance of the first memristor as a lower voltage bound of the first analog voltage range; and
    setting a second conductance of the second memristor as an upper voltage bound of the first analog voltage range.

6. The method of claim 5, wherein the respective parameter value for the first parameter in the search word is a first parameter value, the method further comprising:
    applying, to the aCAM, a data line voltage corresponding to the first parameter value, wherein the data line voltage is received at the first cell; and
    determining, based at least in part on an outcome at the first cell of applying the data line voltage, whether the first parameter value falls within the first range of analog values.

7. The method of claim 6, further comprising pre-charging a match line of the aCAM to a high voltage, wherein determining whether the first parameter value falls within the first range of analog values comprises:
    determining whether the data line voltage discharges the match line;
    determining that the data line voltage is within the first analog voltage range defined by the lower voltage bound and the upper voltage bound responsive to a determination that the data line voltage discharges the match line or determining that the data line voltage does not fall within the first analog voltage range responsive to a determination that the data line voltage does not discharge the match line; and
    determining that the first parameter value falls within the first range of analog values responsive to a determination that the data line voltage is within the first analog voltage range or determining that the first parameter value does not fall within the first range of analog values responsive to a determination that the data line voltage does not fall within the first analog voltage range.

8. The method of claim 7, wherein the aCAM comprises a stored word corresponding to the first logical rule, the stored word including the first range of analog values stored for the first parameter and a respective value or range of values stored for each other parameter, the method further comprising:
    determining that the search word does not match the stored word based at least in part on determining that the first parameter value does not fall within the first analog range of values.

9. The method of claim 1, wherein the respective value specified for the optimized parameter in the search query is a second parameter value, the method further comprising:
    determining that the search word matches a first stored word in the aCAM, the first stored word encoding the subset of values corresponding to the set of evaluable conditions of a first logical rule of the set of logical rules;

determining that a stored value of the optimized parameter satisfies a condition with respect to the second parameter value; and returning, as a match result for the search query, a memory address at which the first stored word is stored in the aCAM.

10. The method of claim 9, wherein determining that the stored value of the optimized parameter satisfies the condition with respect to the second parameter value comprises determining that the stored value of the optimized parameter is less than or equal to the second parameter value.

11. The method of claim 1, further comprising:

determining that the search word matches a first stored word in the aCAM, the first stored word encoding the subset of values corresponding to the set of evaluable conditions of a first logical rule of the set of logical rules;

performing a lookup of a memory different from the aCAM for a first stored value of an output parameter corresponding to the first stored word in the aCAM; and returning, as a match result for the search query, the first stored value of the output parameter.

12. The method of claim 1, wherein the respective value in the search for a particular parameter is a flexible value that matches against any value stored for the particular parameter in the aCAM.

13. The method of claim 1, wherein the respective value specified for the optimized parameter in the search query is a maximum value for the optimized parameter, and wherein determining whether to modify the specified maximum value for the optimized parameter comprises performing an iterative process comprising:

determining that the number of matching results is less than a minimum threshold number;

increasing the maximum value for the optimized parameter;

generating an updated search query comprising the increased maximum value for the optimized parameter; and searching the aCAM to determine an updated number of matching results for the updated search query, wherein the iterative process is performed until the updated number of matching results returned for the updated search query is not less than the minimum threshold number.

14. The method of claim 1, wherein the respective value specified for the optimized parameter in the search query is a maximum value for the optimized parameter, and wherein determining whether to modify the specified maximum value for the optimized parameter comprises performing an iterative process comprising:

determining that the number of matching results is greater than a maximum threshold number;

decreasing the maximum value for the optimized parameter;

generating an updated search query comprising the decreased maximum value for the optimized parameter; and searching the aCAM to determine an updated number of matching results for the updated search query, wherein the iterative process is performed until the updated number of matching results returned for the updated search query is not greater than the maximum threshold number.

15. The method of claim 1, wherein searching the aCAM comprises performing a fuzzy search that identifies a match for at least one respective parameter value based on the at least one respective parameter value falling within a fuzzy match area that extends beyond the stored at least one range of analog values.

16. The method of claim 1, further comprising:

representing the set of logical rules as a set of node chains, wherein each node chain includes a respective series of decision nodes corresponding to a respective logical rule in the set of logical rules, wherein each respective series of decision nodes includes the subset of values corresponding to the set of evaluable conditions of the respective logical rule, wherein populating the data structure comprises populating a table with the subset of values in each respective series of decision nodes.

17. The method of claim 16, wherein encoding the set of values in the aCAM comprises mapping each subset of values to a respective row of the aCAM.

18. A non-transitory computer readable storage medium storing instructions that, when executed by a processor, cause the processor to:

obtain a set of logical rules, wherein each logical rule includes a respective set of evaluable conditions relating to a set of parameters;

determine a set of values including a respective subset of values corresponding to each set of evaluable conditions, the set of values including at least one range of analog values;

encode the set of values in an analog content addressable memory (aCAM) wherein each row of the aCAM is a stored word that encodes the subset of values corresponding to the set of evaluable conditions of a respective logical rule;

receive a search query containing a search word comprising a respective parameter value for each parameter in the set of parameters, the search query further specifying a respective parameter value for an optimized parameter;

search the aCAM for the search word;

determine a number of match results for the search word; and perform an optimization process to optimize the respective parameter value for the optimized parameter based at least in part on the number of match results.

19. The non-transitory computer readable storage medium of claim 18, wherein the set of values comprises a flexible value corresponding to a first parameter of the set of parameters, and wherein, after encoding the flexible value in the aCAM, the flexible value matches any search value specified for the first parameter.

20. A system, comprising:

a memory storing machine-executable instructions; and a processor configured to access the memory and execute the machine-executable instructions to:

obtain a set of logical rules;

determine a set of values corresponding to the set of logical rules, the set of values including at least one range of analog values;

encode the set of values in an analog content addressable memory (aCAM) wherein each row of the aCAM is a stored word that encodes a subset of values corresponding to a respective logical rule;

receive a search query containing a search word comprising a respective parameter value for each parameter in the set of parameters, the search query further specifying a respective parameter value for an optimized parameter;

search the aCAM for the search word;
determine a number of match results for the search word; and
perform an optimization process to optimize the respective parameter value for the optimized parameter based at least in part on the number of match results.

* * * * *